United States Patent
Choi et al.

(10) Patent No.: US 12,356,606 B2
(45) Date of Patent: Jul. 8, 2025

(54) THREE-DIMENSIONAL NAND SEMICONDUCTOR MEMORY DEVICE WITH INTERVENING PLUG AND METHOD OF MANUFACTURING THE SEMICONDUCTOR MEMORY DEVICE

(71) Applicant: SK hynix Inc., Icheon-si (KR)

(72) Inventors: Won Geun Choi, Icheon-si (KR); Jang Won Kim, Icheon-si (KR); Jung Shik Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 251 days.

(21) Appl. No.: 17/825,873

(22) Filed: May 26, 2022

(65) Prior Publication Data

US 2023/0126213 A1 Apr. 27, 2023

(30) Foreign Application Priority Data

Oct. 26, 2021 (KR) .................. 10-2021-0143976

(51) Int. Cl.
*H10B 12/00* (2023.01)
(52) U.S. Cl.
CPC ......... *H10B 12/31* (2023.02); *H10B 12/0335* (2023.02); *H10B 12/34* (2023.02)
(58) Field of Classification Search
CPC .... H10B 12/31; H10B 12/0335; H10B 12/34; H01L 21/265; H01L 21/28273; H01L 21/28282; H01L 21/76229; H01L 27/0688; H01L 27/11521; H01L 27/11568; H01L 27/11578; H01L 27/11582; H01L 27/2463; H01L 29/45; H01L 29/513; H01L 27/11565
See application file for complete search history.

(56) References Cited

U.S. PATENT DOCUMENTS

| | | | | |
|---|---|---|---|---|
| 10,685,977 B2* | 6/2020 | Kim | ....................... | H10B 43/10 |
| 11,621,277 B2* | 4/2023 | Titus | ..................... | H10B 43/27 |
| | | | | 257/324 |
| 2010/0109065 A1* | 5/2010 | Oh | ...................... | H01L 27/0688 |
| | | | | 257/314 |
| 2013/0161821 A1* | 6/2013 | Hwang | .................. | H10B 43/27 |
| | | | | 257/E21.585 |
| 2015/0340374 A1* | 11/2015 | Jung | .................... | H10D 30/025 |
| | | | | 438/258 |

(Continued)

FOREIGN PATENT DOCUMENTS

| KR | 101503876 B1 | 3/2015 |
|---|---|---|
| KR | 101785690 B1 | 10/2017 |
| KR | 1020210010210 A | 1/2021 |

*Primary Examiner* — Nicholas J Tobergte
(74) *Attorney, Agent, or Firm* — WILLIAM PARK & ASSOCIATES LTD.

(57) ABSTRACT

The present technology includes a semiconductor memory device and a method of manufacturing the semiconductor memory device. The semiconductor memory device includes a first stack structure over a lower structure in which a cell region and a slimming region are defined, including a plurality of first gate lines, a first interlayer insulating structure over the first stack structure, a second stack structure over the first interlayer insulating structure, and a plurality of vertical plugs passing through the first stack structure, the first interlayer insulating structure and the second stack structure in the cell region.

15 Claims, 34 Drawing Sheets

(56) References Cited

U.S. PATENT DOCUMENTS

| | | | | |
|---|---|---|---|---|
| 2018/0308858 A1* | 10/2018 | Hopkins | ............. | H01L 29/1037 |
| 2019/0378849 A1* | 12/2019 | Tao | ........................ | H10B 43/27 |
| 2021/0104537 A1* | 4/2021 | Lee | ........................ | H10B 43/27 |
| 2021/0104539 A1* | 4/2021 | Lee | ........................ | H10B 41/27 |
| 2022/0102369 A1* | 3/2022 | Chung | ................... | H10B 43/40 |

* cited by examiner

THREE-DIMENSIONAL NAND SEMICONDUCTOR MEMORY DEVICE WITH INTERVENING PLUG AND METHOD OF MANUFACTURING THE SEMICONDUCTOR MEMORY DEVICE

CROSS-REFERENCE TO RELATED APPLICATION

The present application claims priority under 35 U.S.C. § 119(a) to Korean patent application number 10-2021-0143976 filed on Oct. 26, 2021, in the Korean Intellectual Property Office, the entire disclosure of which is incorporated by reference herein.

BACKGROUND

1. Technical Field

The present disclosure relates to a semiconductor memory device and a method of manufacturing the semiconductor memory device, and more particularly, to a semiconductor memory device including a plurality of stacked gate lines, and a method of manufacturing the semiconductor memory device.

2. Related Art

A semiconductor memory device may include a volatile memory device in which stored data is lost when power supply is cut off, and a nonvolatile memory device in which stored data is maintained even though power supply is cut off.

Among the volatile memory device and the non-volatile memory device, the nonvolatile memory device is more required to have a higher capacity and higher integration degree as usage of a portable electronic device such as a mobile phone and a notebook computer increases.

Therefore, integration degree improvement of a two-dimensional nonvolatile memory device that forms a memory cell as a single layer on a substrate reaches a limit, a nonvolatile memory device of a three-dimensional structure, in which memory cells are vertically stacked on a substrate has been proposed.

SUMMARY

According to an embodiment of the present disclosure, a semiconductor memory device may include a first stack structure over a lower structure in which a cell region and a slimming region are defined, including a plurality of first gate lines, a first interlayer insulating structure over the first stack structure, a second stack structure over the first interlayer insulating structure and including a plurality of second gate lines, and a plurality of vertical plugs passing through the first stack structure, the first interlayer insulating structure and the second stack structure in the cell region.

According to an embodiment of the present disclosure, a method of manufacturing a semiconductor memory device may include forming a first stack structure on a lower structure in which a cell region and a slimming region are defined, forming a first interlayer insulating structure over the first stack structure, forming a second interlayer insulating structure over the first interlayer insulating structure, forming a second stack structure on the second interlayer insulating structure, forming a vertical plug passing through the second stack structure, the second interlayer insulating structure, the first interlayer insulating structure, and the first stack structure in the cell region, and performing an etching process so that an edge of the second stack structure, the second interlayer insulating structure, the first stack structure and the first interlayer insulating structure has a step shape, a height and a distance of the step shape of the first interlayer insulating structure is different from a height and a distance of the step shape of a portion except for the first interlayer insulating structure, and a height and a distance of the step shape of the second interlayer insulating structure is different from a height and a distance of the step shape of a portion except for the second interlayer insulating structure, in the slimming region.

According to an embodiment of the present disclosure, a method of manufacturing a semiconductor memory device may include forming a first stack structure on a lower structure in which a cell region and a slimming region are defined, forming a first interlayer insulating structure on the first stack structure, forming a first vertical plug passing through the first stack structure and the first interlayer insulating structure in the cell region, forming a second interlayer insulating structure on the first interlayer insulating structure, forming a third vertical plug passing through the second interlayer insulating structure in the cell region, forming a third interlayer insulating structure on the second interlayer insulating structure, forming a second stack structure on the third interlayer insulating structure, forming a second vertical plug passing through the second stack structure and the third interlayer insulating structure in the cell region, and performing an etching process so that an edge of the second stack structure, the first to third interlayer insulating structure, and the first stack structure has step shape, a height and a distance of a step shape of the first interlayer insulating structure is different from a height and a distance of the step shape of a portion except for the first interlayer insulating structure, and a height and a distance of a step shape of the third interlayer insulating structure is different from a height and a distance of the step shape of a portion except for the third interlayer insulating structure, in the slimming region.

DETAILED DESCRIPTION

Specific structural or functional descriptions of the embodiments according to the concept of the present disclosure disclosed in the present specification or application are only exemplified for the purpose of describing the embodiments according to the concept of the present disclosure, and the embodiments according to the concept of the present disclosure may be carried out in various forms and should not be construed as being limited to the embodiments described in the present specification or application.

It will be understood that, although the terms first, second, third etc. may be used herein to describe various elements, components, regions, layers, plugs, stack, and/or sections, these elements, components, regions, layers, plugs, stack, and/or sections should not be limited by these terms. These terms are only used to distinguish one element, component, region, layer, plug, stack, or section from another region, layer, plug, stack, or section. Thus, a first element, component, region, layer, plug, stack, or section discussed below could be termed a second element, component, region, layer, plug, stack, or section without departing from the teachings of the present disclosure.

An embodiment of the present disclosure provides a semiconductor memory device capable of improving reliability of the semiconductor memory device by preventing a bridge from occurring in a memory block, and a method of manufacturing the semiconductor memory device.

The present technology, in some embodiments, may improve reliability of the semiconductor memory device by preventing or mitigating a bridge from occurring in a memory block.

Figure 1:
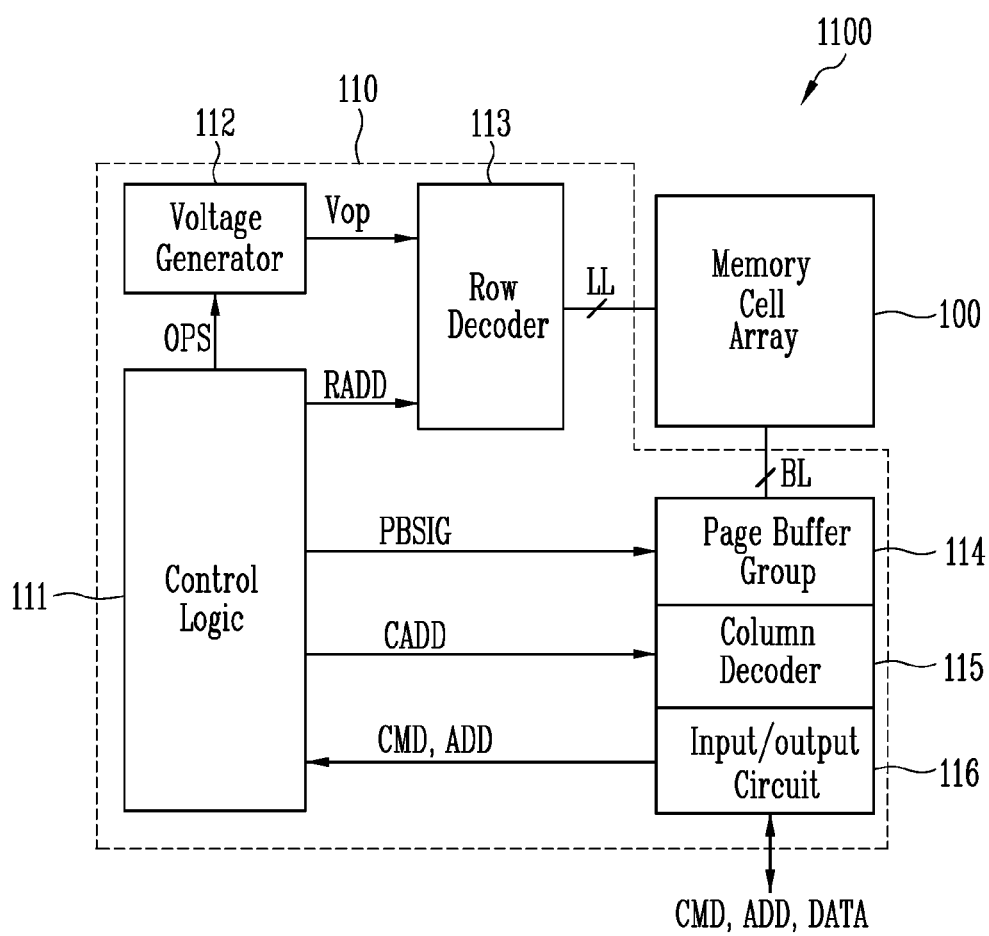
FIG. 1 is a diagram illustrating a semiconductor memory device according to an embodiment of the present disclosure.

FIG. 1 is a diagram illustrating a semiconductor memory device according to an embodiment of the present disclosure.

Referring to FIG. 1, the semiconductor memory device 1100 may include a memory cell array 100 capable of storing data and peripheral circuits 110 capable of performing a program, read, or erase operation of the memory cell array 100.

The memory cell array 100 may include a plurality of memory blocks including nonvolatile memory cells. Local lines LL may be connected to each of the memory blocks, and bit lines BL may be commonly connected to each of the memory blocks.

The peripheral circuits 110 may include control logic 111, a voltage generator 112, a row decoder 113, a page buffer group 114, a column decoder 115, and an input/output circuit 116. The control logic 111 may be implemented as hardware, software, or a combination of hardware and software. For example, the control logic 111 may be a control logic circuit operating in accordance with an algorithm and/or a processor executing control logic code.

The control logic 111 may control the voltage generator 112, the row decoder 113, the page buffer group 114, the column decoder 115, and the input/output circuit 116 according to a command CMD and an address ADD. For example, the control logic 111 may output an operation signal OPS and a page buffer control signal PBSIG in response to the command CMD, and may output a row address RADD and a column address CADD in response to the address ADD.

The voltage generator 112 may generate and output operation voltages Vop necessary for the program, read, or erase operation in response to the operation signal OPS. For example, the voltage generator 112 may generate and output the operation voltages Vop such as a program voltage, a read voltage, an erase voltage, and a pass voltage.

The row decoder 113 may transmit the operation voltages Vop to a selected memory block through the local lines LL in response to the row address RADD.

The page buffer group 114 may include a plurality of page buffers connected to the bit lines BL. The page buffer group 114 may temporarily store data during the program or read operation in response to the page buffer control signal PBSIG.

The column decoder 115 may transmit data between the page buffer group 114 and the input/output circuit 116 in response to the column address CADD.

The input/output circuit 116 may receive the command CMD and the address ADD from an external device and transmit the command CMD and the address ADD to the control logic 111. The input/output circuit 116 may transmit data DATA received from the external device to the column decoder 115 during the program operation, and output the data DATA received from the column decoder 115 to the external device during the read operation.

Figure 2:
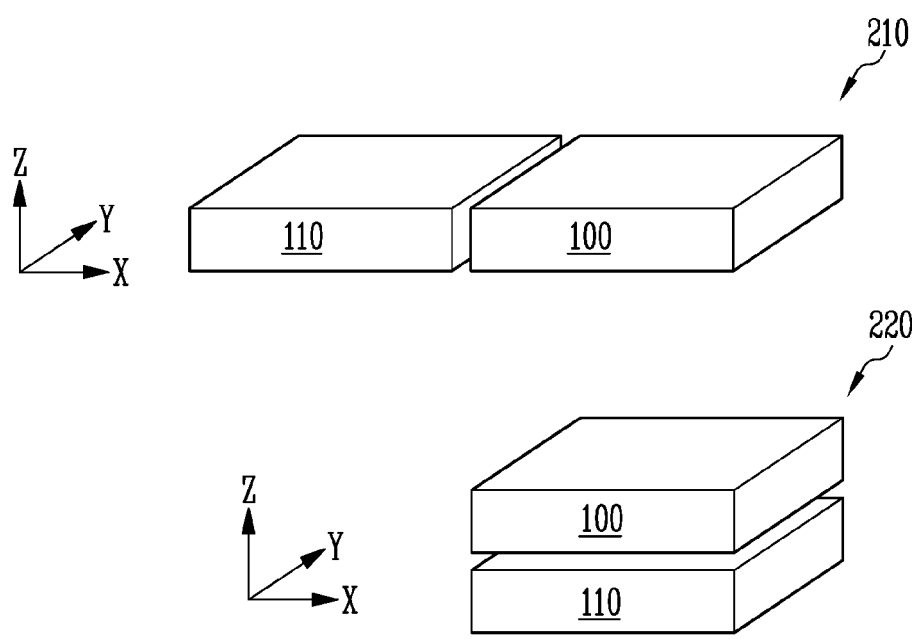
FIG. 2 is a diagram illustrating a disposition between a memory cell array and peripheral circuits.

FIG. 2 is a diagram illustrating a disposition between the memory cell array and the peripheral circuits.

Referring to FIG. 2, the memory cell array 100 and the peripheral circuits 110 described above with reference to FIG. 1 may be disposed in various structures. For example, when a substrate is disposed in an X-Y direction and horizontally, the memory cell array 100 and the peripheral circuits 110 may also be disposed in parallel to each other in the X-Y direction (210). Alternatively, the memory cell array 100 may also be disposed on the peripheral circuits 110 in a direction (Z direction) perpendicular to the substrate (220). That is, the peripheral circuits 110 may be disposed between the substrate and the memory cell array 100.

Figure 3:
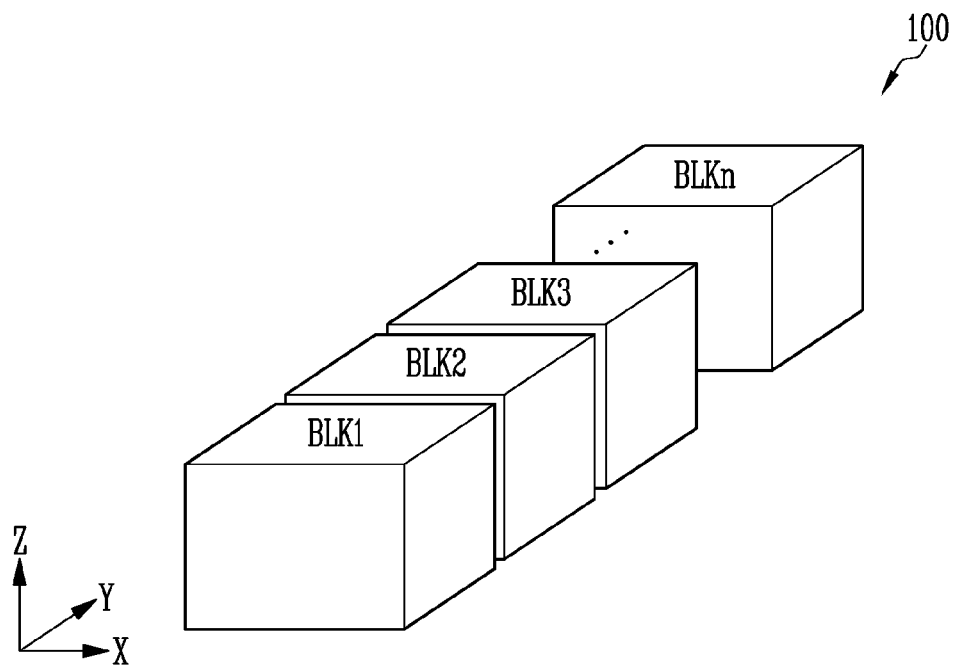
FIG. 3 is a diagram illustrating a memory cell array including memory blocks formed in a three-dimensional structure.

FIG. 3 is a diagram illustrating a memory cell array including memory blocks formed in a three-dimensional structure.

Referring to FIG. 3, when the memory cell array 100 includes memory blocks BLK1 to BLKn formed in a three-dimensional structure, the memory blocks BLK1 to BLKn may be arranged in a Y direction. The Y direction may be a direction in which the bit lines BL of FIG. 1 extend.

Although the memory cell array 100 shown in FIG. 3 includes one plane, the memory cell array 100 may include a plurality of planes. The plurality of planes may be arranged in an X direction, and the memory blocks included in each plane may be arranged in the Y direction in the corresponding plane.

Figure 4:
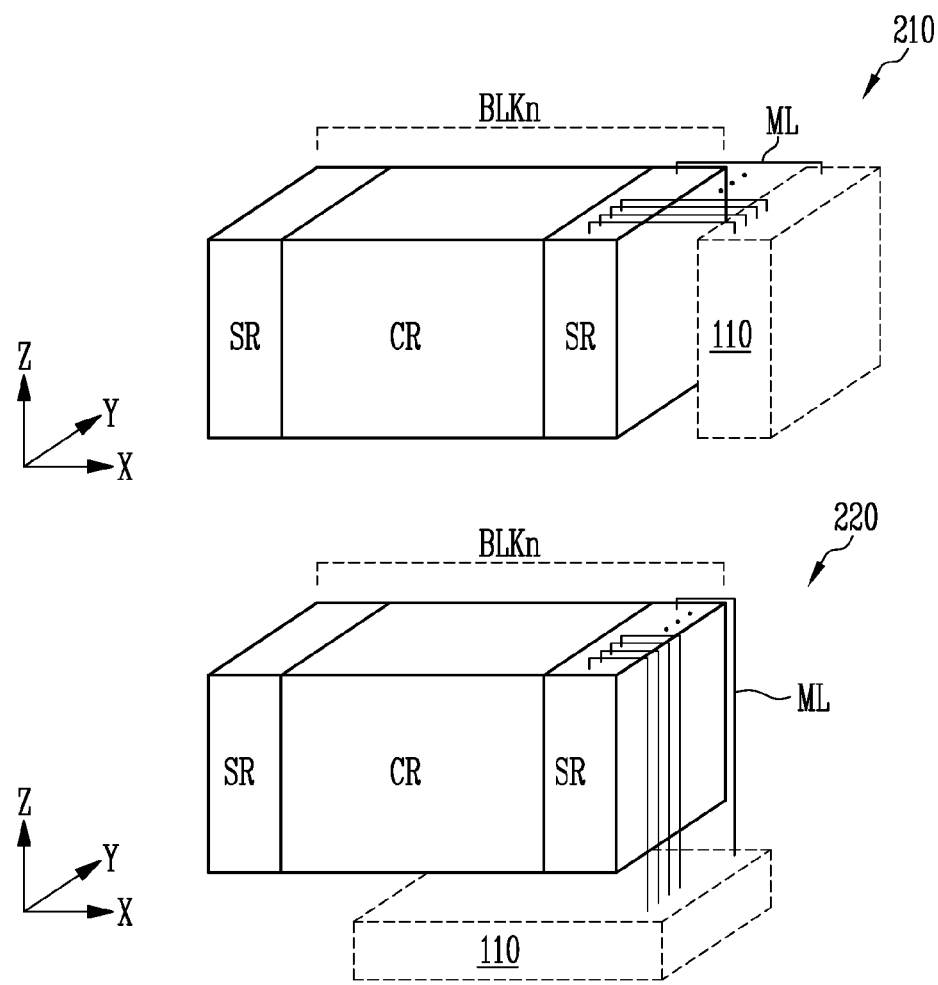
FIG. 4 is a diagram illustrating a connection relationship between the memory block and the peripheral circuits.

FIG. 4 is a diagram illustrating a connection relationship between the memory block and the peripheral circuits.

The memory blocks BLK1 to BLKn described above with reference to FIG. 3 may be configured identically to each other. In FIG. 4, any one memory block BLKn among the memory blocks BLK1 to BLKn is shown as an embodiment.

Referring to FIG. 4, the memory block BLKn formed in a three-dimensional structure may include a cell region CR including memory cells, and a slimming region SR for electrically connecting the peripheral circuits 110 and the cell region CR to each other. For example, the cell region CR may include a plurality of vertical strings in which the memory cells and select transistors are stacked, and the slimming region SR may include end terminals of a plurality of gate lines connected to the memory cells and the select transistors. For example, in the slimming region SR, the gate lines may be stacked in a step shape, and may be formed in a step shape in which a gate line disposed at a relative lower portion extends longer than a gate line disposed at an upper portion. The gate lines exposed by the step shape may be connected to the peripheral circuits 110 through contact plugs.

When the peripheral circuits 110 are disposed in a horizontal direction (X direction) with the memory block BLKn (210), a plurality of lines ML for electrically connecting the slimming region SR and the peripheral circuits 110 to each other may be formed. For example, in a 210 structure, the plurality of lines ML may extend in the X direction and may be spaced apart from each other in the Y direction.

When the peripheral circuits 110 are disposed under the memory block BLKn (Y direction) (220), the plurality of lines ML for electrically connecting the slimming region SR and the peripheral circuits 110 to each other may extend along the Z direction and may be spaced apart from each other along the Y direction.

Figure 5:
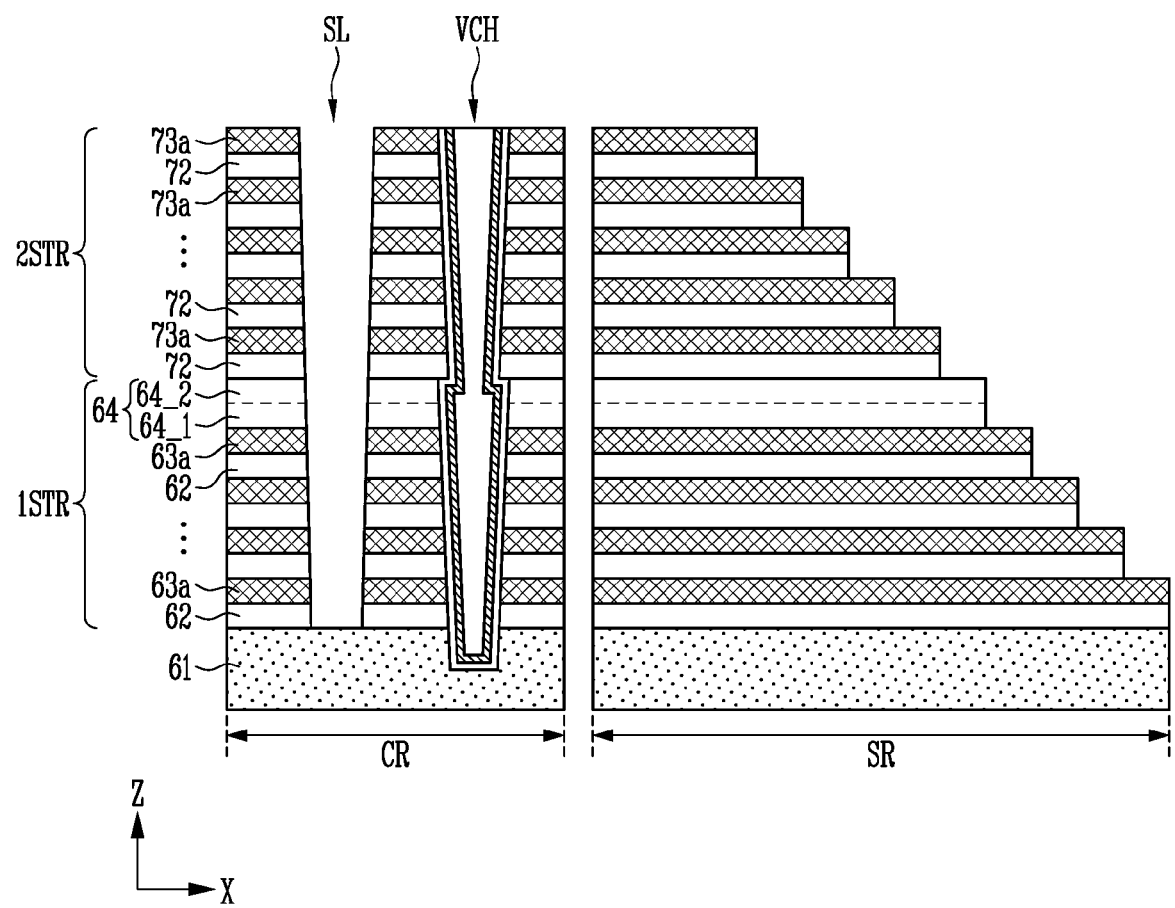
FIG. 5 is a diagram illustrating a structure according to a first embodiment of the present disclosure.

FIG. 5 is a diagram illustrating a structure according to a first embodiment of the present disclosure.

Referring to FIG. 5, a double stack structure in which a first stack structure 1STR and a second stack structure 2STR are stacked on a lower structure 61 in which a cell region CR and a slimming region SR are defined may be formed. For example, the first stack structure 1STR may include first material layers 62, conductive layers 63*a*, and a first interlayer insulating structure 64 alternately stacked on the lower structure 61. The first interlayer insulating structure 64 may be formed on an uppermost end of the first stack structure 1STR, and may include third material layers 64_1 and 64_2 stacked on each other. The first material layers 62 and the first interlayer insulating structure 64 may be formed of the same material. For example, the first material layers 62 and the first interlayer insulating structure 64 may be formed of an oxide layer. The conductive layers 63*a* may be used as a word line or a selection line in the memory block, and may be formed of at least one layer among tungsten (W), cobalt (Co), nickel (Ni), molybdenum (Mo), silicon (Si), and polysilicon (poly-Si). The second stack structure 2STR may be formed on the first interlayer insulating structure 64. For example, the second stack structure 2STR may include fourth material layers 72 and conductive layers 73*a* alternately stacked on the first interlayer insulating structure 64. The fourth material layers 72 may be formed of the same material as the first material layers 62, and the conductive layers 73*a* may be formed of the same material as the conductive layers 63*a*. In an embodiment the conductive layers 63*a* and 73*a* may be used as gate lines. In an embodiment, a slit SL in the cell region CR may pass through the first stack structure 1STR and the second stack structure 2STR.

In the slimming region SR, an edge of the first stack structure 1STR and the second stack structure 2STR including the first interlayer insulating structure 64 may be formed in a successive step shape.

At least one or more vertical plugs VCH vertically passing through the first and second stack structures 1STR and 2STR may be included in the cell region CR. Since a portion of the vertical plug VCH formed in the first stack structure 1STR is formed before a portion formed in the second stack structure 2STR, in a region where the first and second stack structures 1STR and 2STR are in contact with each other, a pattern of the vertical plug VCH may be rapidly changed. For example, a width of a lower end of the vertical plug VCH formed in the first stack structure 1STR may be narrower than a width of an upper end, and a width of a lower end of the vertical plug VCH formed in the second stack structure 2STR may be narrower than a width of an upper end. Since a portion where the width of the vertical plug VCH of the first stack structure 1STR is widest and a portion where the width of the vertical plug VCH of the second stack structure 2STR is narrowest are in contact with each other, a pattern change of the vertical plug VCH may be great in a region where portions where the widths are different from each other are in contact with each other.

As described above, when a gate line is formed in a region where the pattern change of the vertical plug VCH is great, a bridge may occur between the vertical plug VCH and the gate line due to a characteristic of a manufacturing process.

Therefore, in the first embodiment, the first interlayer insulating structure 64 may be formed so that the vertical plug VCH and the gate line do not overlap each other in the region where the pattern change of the vertical plug VCH is great. The first interlayer insulating structure 64 may be formed to be thicker than a thickness of each of the first material layers 62 of the first stack structure 1STR and a thickness of each of the fourth material layers 72 of the second stack structure 2STR so that a region where the pattern change of the vertical plug VCH is great may be sufficiently included in the first interlayer insulating structure 64.

FIGS. 6 to 17 are diagrams illustrating a method of manufacturing the semiconductor memory device according to the first embodiment of the present disclosure.

Figure 6:
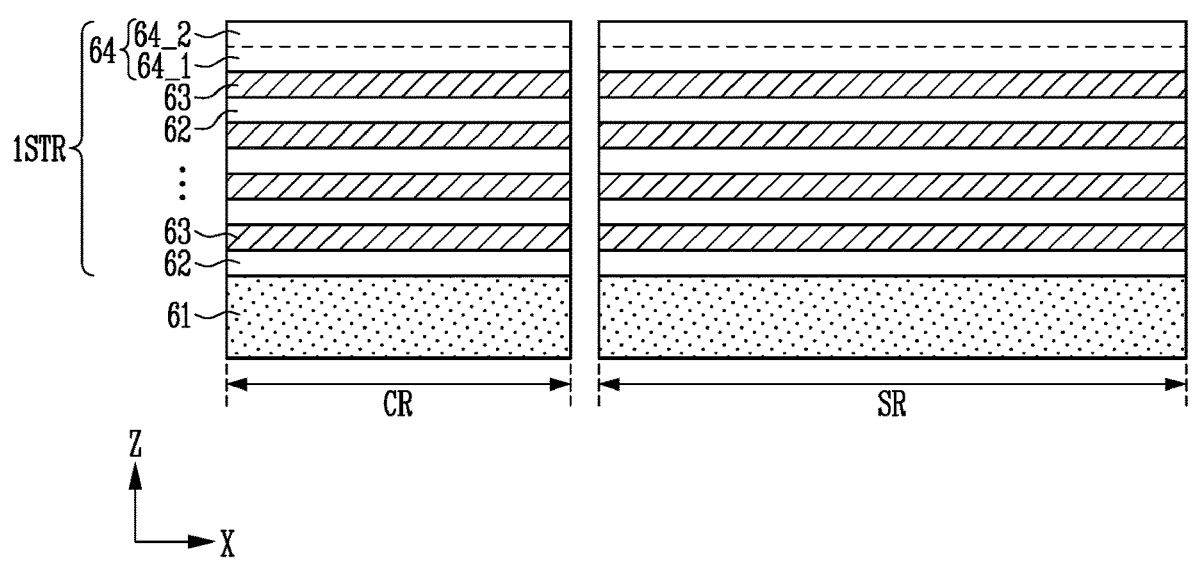
FIGS. 6, 7, 8, 9, 10, 11, 12, 13, 14, 15, 16, and 17 are diagrams illustrating a method of manufacturing the semiconductor memory device according to the first embodiment of the present disclosure.

Referring to FIG. 6, the first stack structure 1STR may be formed on the lower structure 61 in which the cell region CR and the slimming region SR are defined. The lower structure 61 may be a semiconductor substrate or may include a structure corresponding to peripheral circuits formed on the semiconductor substrate.

The first stack structure 1STR may include first and second material layers 62 and 63 alternately stacked. The first material layers 62 may be for insulating gate electrodes to be formed in a subsequent process from each other, and the second material layers 63 may be for forming a gate electrode of a memory cell, a selection transistor, or the like. The first and second material layers 62 and 63 may be formed of materials having the same or similar etch selectivity. For example, the second material layers 63 may be sacrificial layers including nitride or the like, and the first material layers 62 may be insulating layers including oxide or the like.

The first interlayer insulating structure 64 may be formed on the uppermost end of the first stack structure 1STR. The first interlayer insulating structure 64 may include at least two or more third material layers 64_1, 64_2 . . . . Although two third material layers 64_1 and 64_2 are shown in FIG. 6 as an example, the number of third material layers 64_1 and 64_2 included in the first interlayer insulating structure 64 is not limited to the number shown in the drawing. The third material layers 64_1 and 64_2 may be formed of the same material as the first material layers 62. For example, the third material layers 64_1 and 64_2 may be for insulating stacked gate electrodes from each other, and may be, for example, an insulating layer including oxide or the like.

Figure 7:
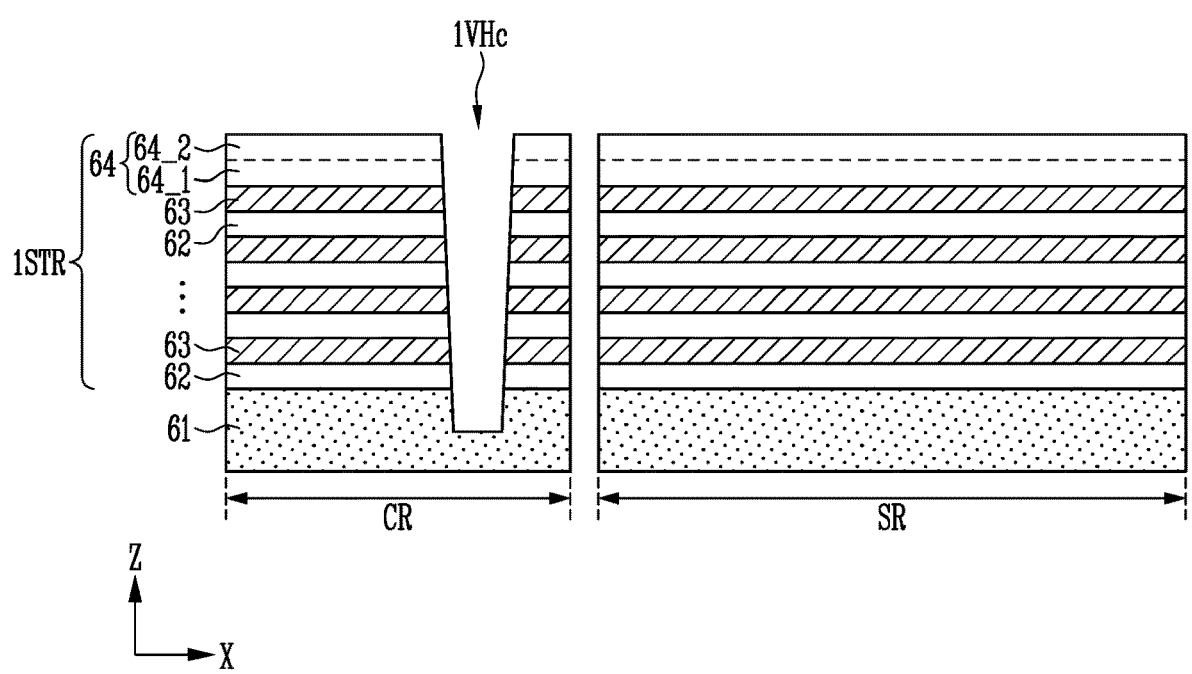

Referring to FIG. 7, at least one first vertical hole 1VHc vertically passing through the first stack structure 1STR may be formed in the cell region CR of the first stack structure 1STR. For example, the first vertical hole 1VHc may be formed in a method of forming a mask pattern (not shown) in which an opening is formed on the third material layer 64_2 formed at the uppermost end of the first stack structure 1STR of the cell region CR and etching the first stack structure 1STR exposed through the opening. The etching process may be performed until the lower structure 61 is exposed. The first vertical hole 1VHc formed in the cell region CR may be formed to form vertical plugs.

Figure 8:
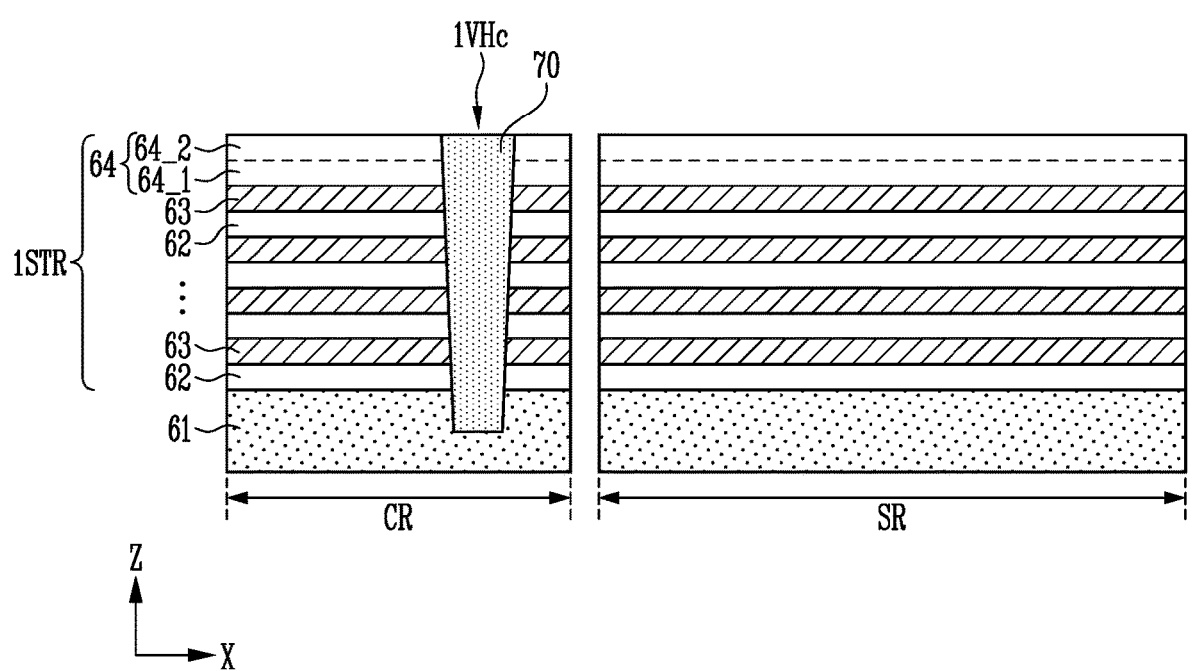

Referring to FIG. 8, a sacrificial layer 70 may be filled in the first vertical holes 1VHc. Since the sacrificial layer 70 is required to be removed faster than the first, second, and third material layers 62, 63, 64_1, and 64_2 during a subsequent etching process, the sacrificial layer 70 may be formed of a material having a high selectivity compared to the first, second, and third material layers 62, 63, 64_1, and 64_2.

Figure 9:
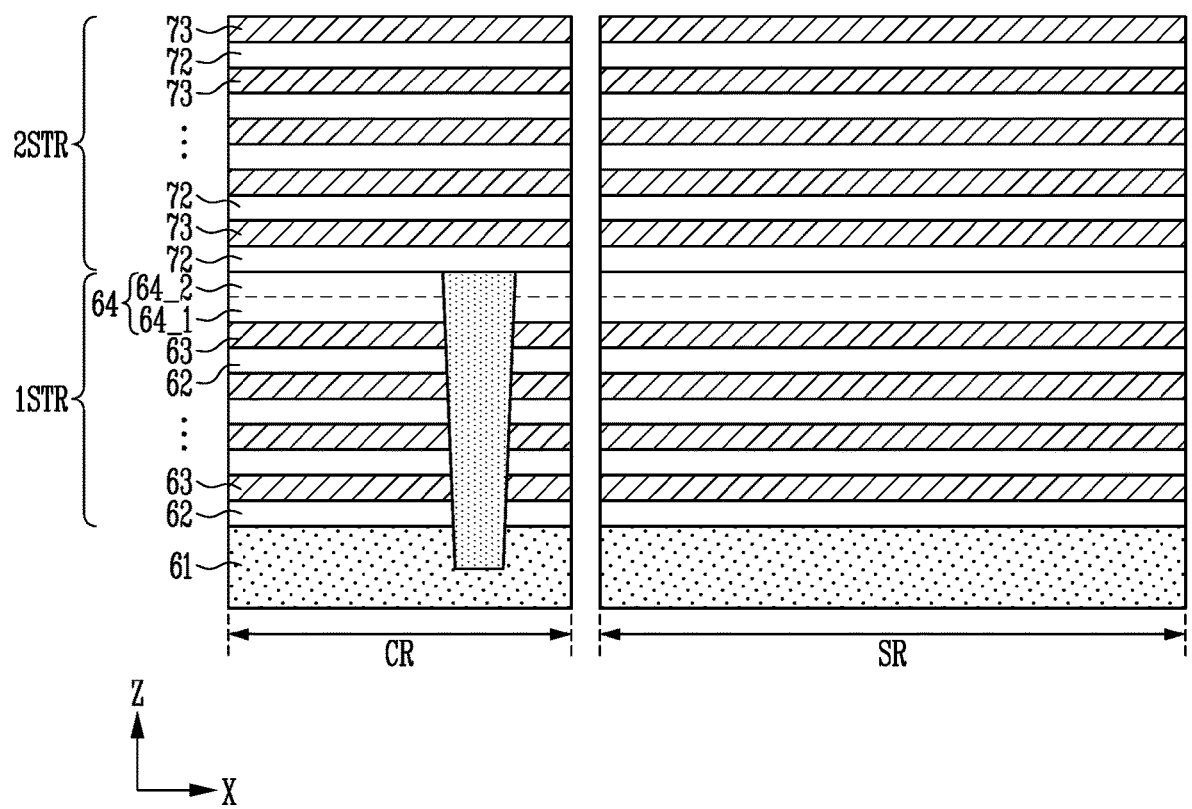

Referring to FIG. 9, the second stack structure 2STR may be formed on the first stack structure 1STR in which the sacrificial layer 70 is formed. The second stack structure 2STR may include fourth and fifth material layers 72 and 73 alternately stacked. For example, the fourth material layers 72 may be formed of the same material as the first material layers 62 of the first stack structure 1STR, and the fifth material layers 73 may be formed of the second material layers 63 of the first stack structure 1STR.

Figure 10:
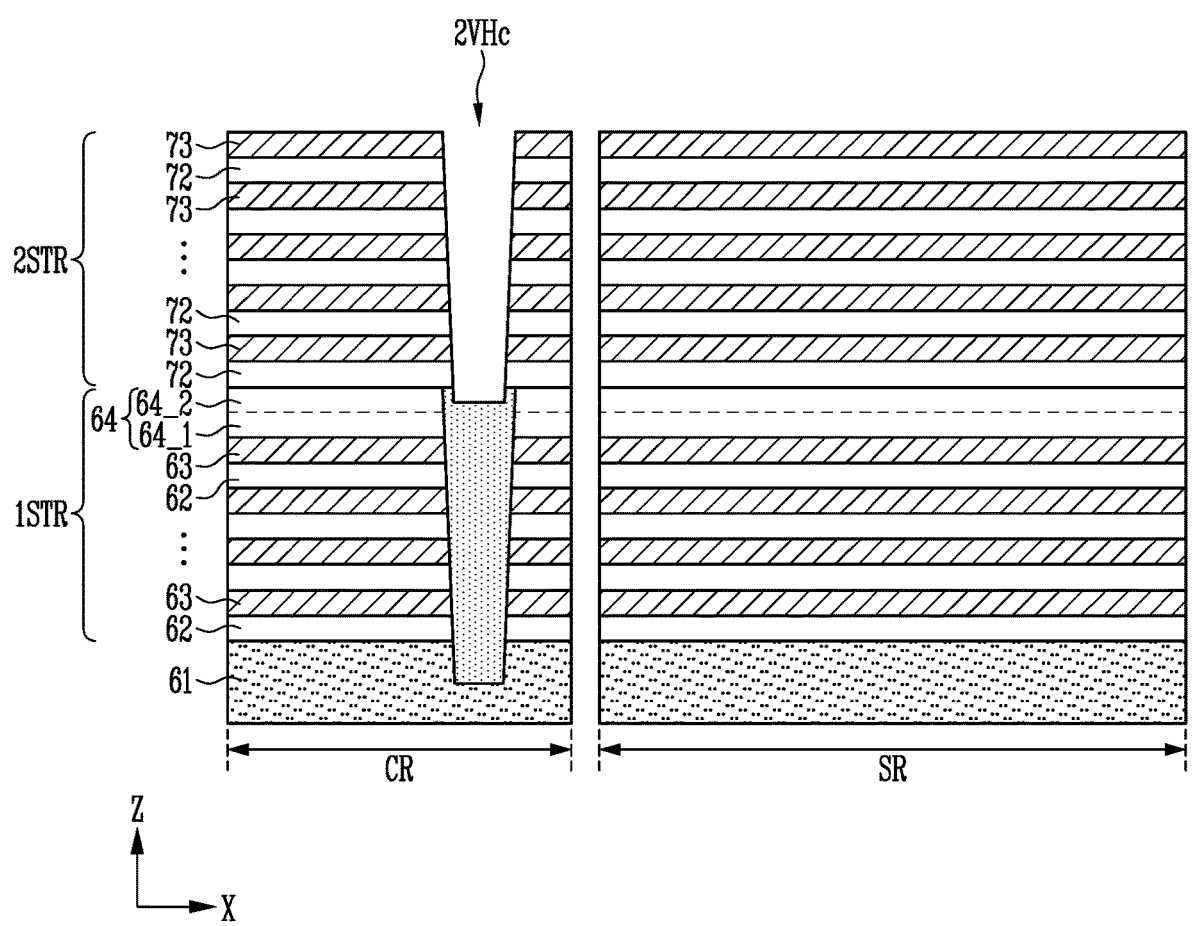

Referring to FIG. 10, a second vertical hole 2VHc vertically passing through the second stack structure 2STR and exposing a portion of the sacrificial layer 70 may be formed. For example, the second vertical hole 2VHc may be formed on the first vertical hole 1VHc.

Figure 11:
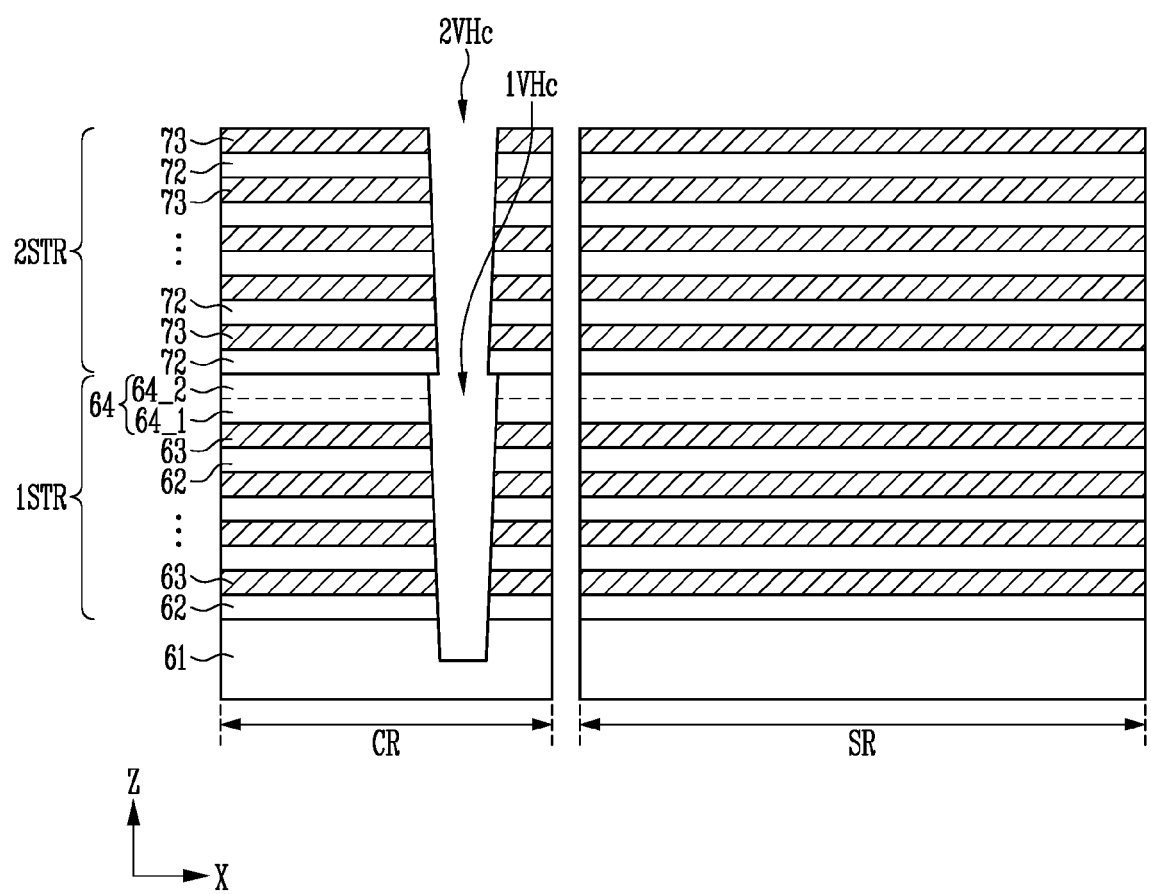

Referring to FIG. 11, an etching process for removing the sacrificial layer 70 of FIG. 8 exposed through the second vertical hole 2VHc may be performed. When the sacrificial layer 70 is removed, the first to fifth material layers 62, 63, 64_1, 64_2, 72, and 73 may be exposed through an inner wall of the first and 20 second vertical holes 1VHc and 2VHc.

Figure 12:
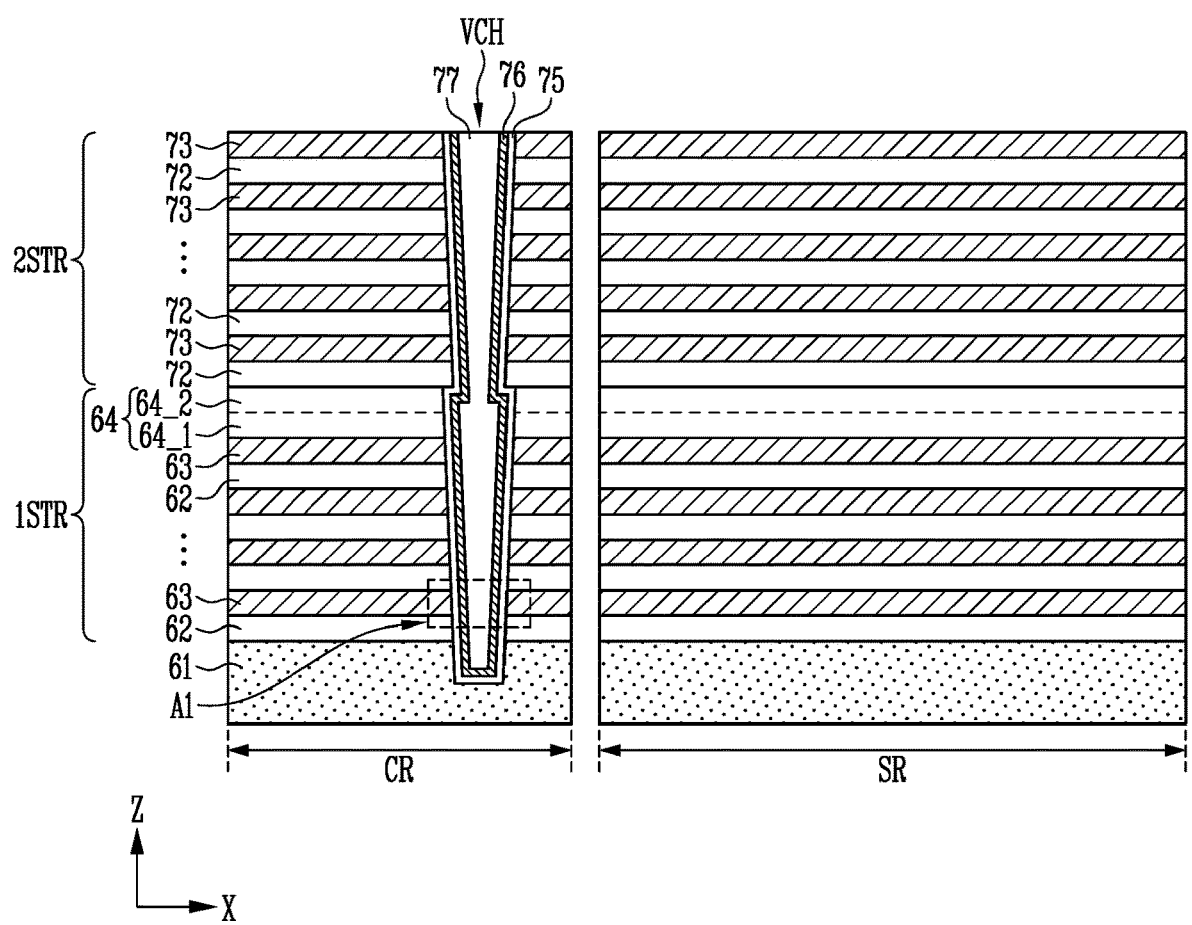
Figure 13:
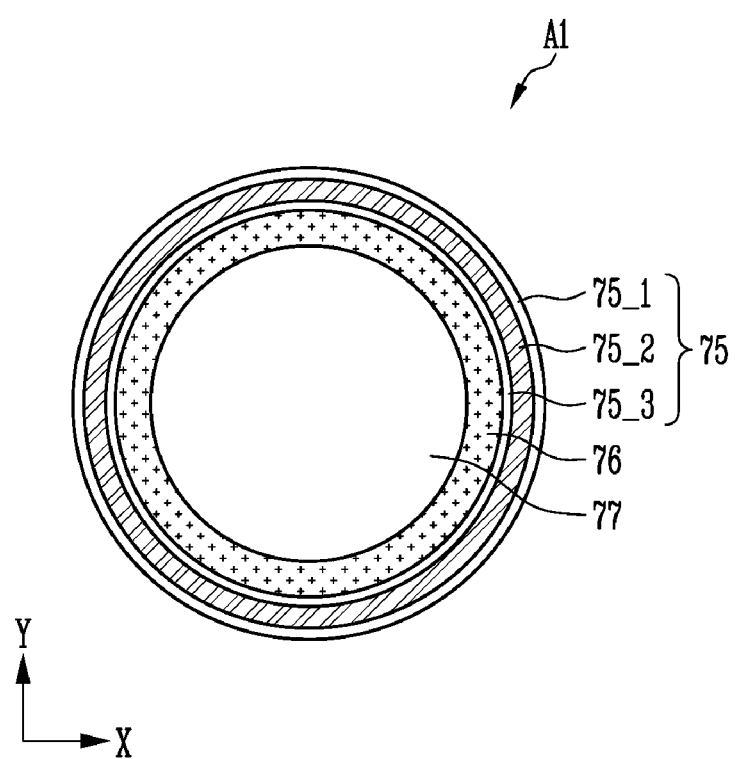

Referring to FIGS. 12 and 13, the vertical plug VCH may be formed in the first and second vertical holes 1VHc and 2VHc. Materials configuring the vertical plug VCH may be used as a memory cell. Detailed structure and manufacturing method of the vertical plug VCH are described with reference to FIGS. 12 and 13.

Referring to A1 of FIG. 13, the vertical plug VCH may include a memory layer 75, a channel layer 76, and a vertical insulating layer 77 sequentially formed along the inner wall of the first and second vertical holes 1VHc and 2VHc.

The memory layer 75 may be formed in a cylindrical shape along the inner wall of the first and second vertical holes 1VHc and 2VHc. The memory layer 75 may include a blocking layer 75_1, a trap layer 75_2, and a tunnel insulating layer (tunnel isolation layer) 75_3 formed in an order adjacent to the first and second vertical holes 1VHc and 2VHc. The blocking layer 75_1 may be formed of an insulating layer including oxide or the like. The trap layer 75_2 may be formed of a material capable of trapping a charge, for example, polysilicon, nitride, a variable resistance material, a phase change material, or the like. The tunnel insulating layer 75_3 may be formed of an insulating layer including oxide or the like. Data may be stored in the vertical plugs VCH formed in the cell region CR, and more specifically, in the trap layer 75_2 of the vertical plugs VCH.

The channel layer 76 may be formed in a cylindrical shape along an inner wall of the memory layer 75 and may be formed of polysilicon. The vertical insulating layer 77 may be formed in a cylindrical shape filling an inside of the channel layer 76, and may be formed of an insulating layer including oxide or the like. Although not shown in the drawing, the channel layer 76 may be formed in a cylindrical shape, and in this case, the vertical insulating layer 77 might not be formed.

Figure 14:
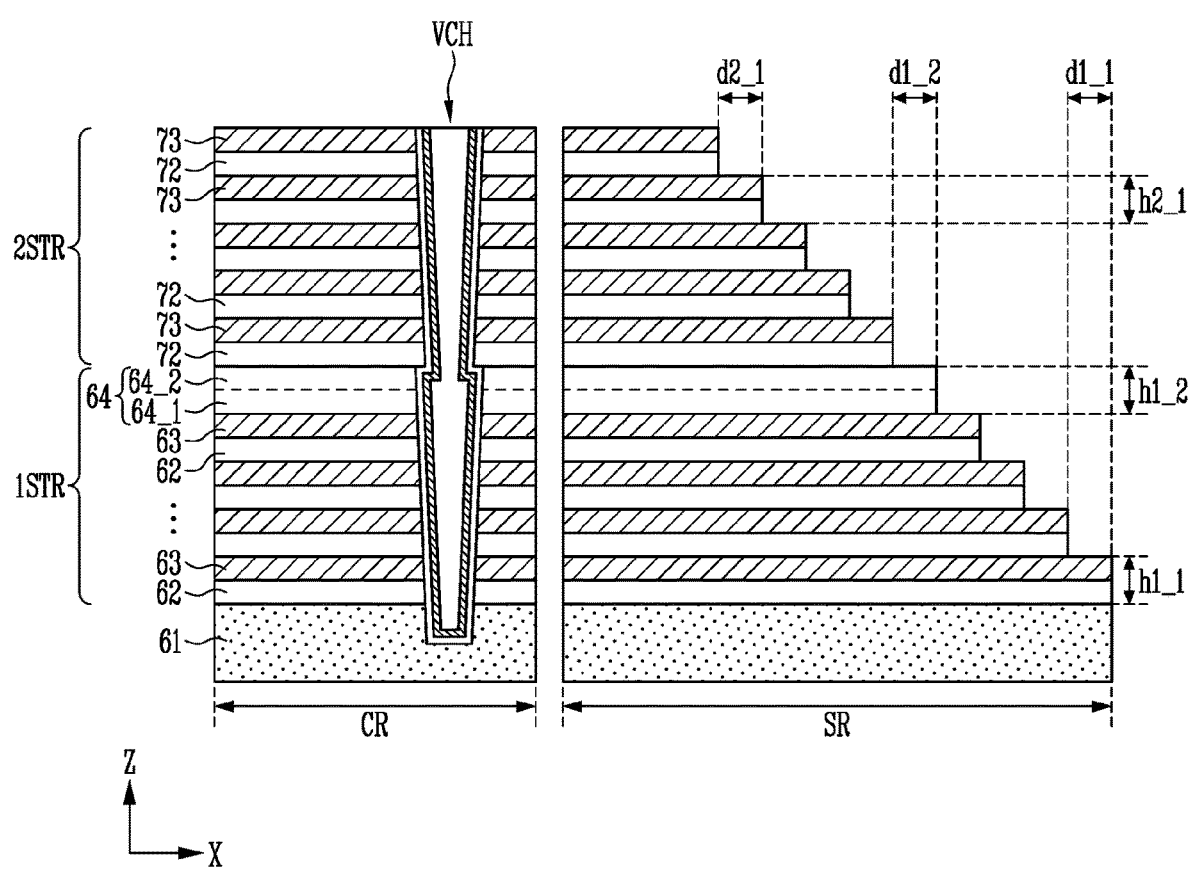

Referring to FIG. 14, a slimming process for exposing each of the second, third, and fifth material layers 63, 64_1, 64_2, and 73 in the slimming region SR may be performed. More specifically, the slimming process may include etching processes sequentially using a plurality of mask patterns in order to form a plurality of step shapes in which the first and second material layers 62 and 63 formed in the slimming region SR are paired, a plurality of step shapes in which the third material layers 64_1 and 64_2 are paired, and a plurality of step shapes in which the fourth and fifth material layers 72 and 73 are paired. The plurality of step shapes in which the first and second material layers 62 and 63 are paired may have a constant height h1_1 and constant distance d1_1, the plurality of step shapes in which the third material layers 64_1 and 64_2 are paired may have constant height h1_2 and constant distance d1_2, and the plurality of step shapes in which the fourth and fifth material layers 72 and 73 are paired may have constant height h2_1 and constant distance d2_1, but the disclosure is not limited thereto. In addition, the height h1_1 or the distance d1_1 of the plurality of step shapes in which the first and second material layers 62 and 63 are paired may be different from the height h1_2 or the distance d1_2 of the plurality of step shapes in which the third material layers 64_1 and 64_2 are paired due to selectivity between materials, and the height h2_1 or the distance d2_1 of the plurality of step shapes in which the fourth and fifth material layers 72 and 73 are paired may be different from the height h1_2 or the distance d1_2 of the plurality of step shapes in which the third material layers 64_1 and 64_2 are paired due to selectivity between materials, but the disclosure is not limited thereto.

Although not shown in the drawing, a first mask pattern may be formed in the entire cell region CR and a portion of the slimming region SR. The first mask pattern may include a first opening exposing a material to be etched in the slimming region SR. For example, the first mask pattern may be formed to cover the entire cell region CR and the portion of the slimming region SR. That is, a portion of the fifth material layer 73 formed at an uppermost end among the first to fifth material layers 62, 63, 64_1, 64_2, 72, and 73 may be exposed through the first opening of the first mask pattern.

An etching process for removing the fifth and fourth material layers 73 and 72 of the uppermost end exposed through the first opening may be performed. The etching process may be performed as an anisotropic etching process so that only a material exposed through the first opening may be removed. The etching process using the first mask pattern may be performed until the fifth material layer 73 positioned under the fourth material layer 72 removed from the slimming region SR is exposed.

When the fifth material layer 73 is exposed in the slimming region SR, the first mask pattern may be removed and a second mask pattern including a second opening may be formed. In order to form a step shape, the second mask pattern may include the second opening narrower than the first opening. For example, the second mask pattern may be formed to cover the entire cell region CR and a portion of the slimming region SR. That is, a portion the fifth and fourth material layers 73 and 72 formed at the uppermost end among the first to fifth material layers 62, 63, 64_2, 72, and 73 exposed through the second opening of the second mask pattern may be exposed.

An etching process for removing the fifth and fourth material layers 73 and 72 of the uppermost end exposed through the second opening may be performed. The etching process may be performed as an anisotropic etching process so that only a material exposed through the second opening may be removed. The etching process using the second mask pattern may be performed until the fifth material layer 73 positioned under the fourth material layer 72 removed from the slimming region SR is exposed.

Subsequently, the second mask pattern may be removed, and an etching process sequentially using mask patterns in which the area of an opening is narrowed according to the above-described mask pattern formation and etching may be performed to form a successive step shape in the slimming region SR. For example, in the slimming region SR, a step shape in which the fifth, third, and second material layers 73, 64_2, and 63 are exposed in each layer may be formed.

The slimming process may be performed so that the edge of the first and second stack structures 1STR and 2STR form a step shape, and an edge of a portion except for the first interlayer insulating structure 64 in the first stack structure 1STR may be formed to have constant height h1_1 and constant distance d1_1 and an edge of the second stack structure 2STR may be formed to have constant height h2_1 and constant distance d2_1. In addition, the height h1_1 or the distance d1_1 of the edge of a portion except for the first interlayer insulating structure 64 in the first stack structure 1STR may be different from the height h1_2 or the distance d1_2 of the edge of the first interlayer insulating structure 64 due to selectivity between materials, and the height h2_1 or the distance d2_1 of the edge of the second stack structure 2STR may be different from the height h1_2 or the distance d1_2 of the edge of the first interlayer insulating structure 64 due to selectivity between materials, but the disclosure is not limited thereto.

Figure 15:
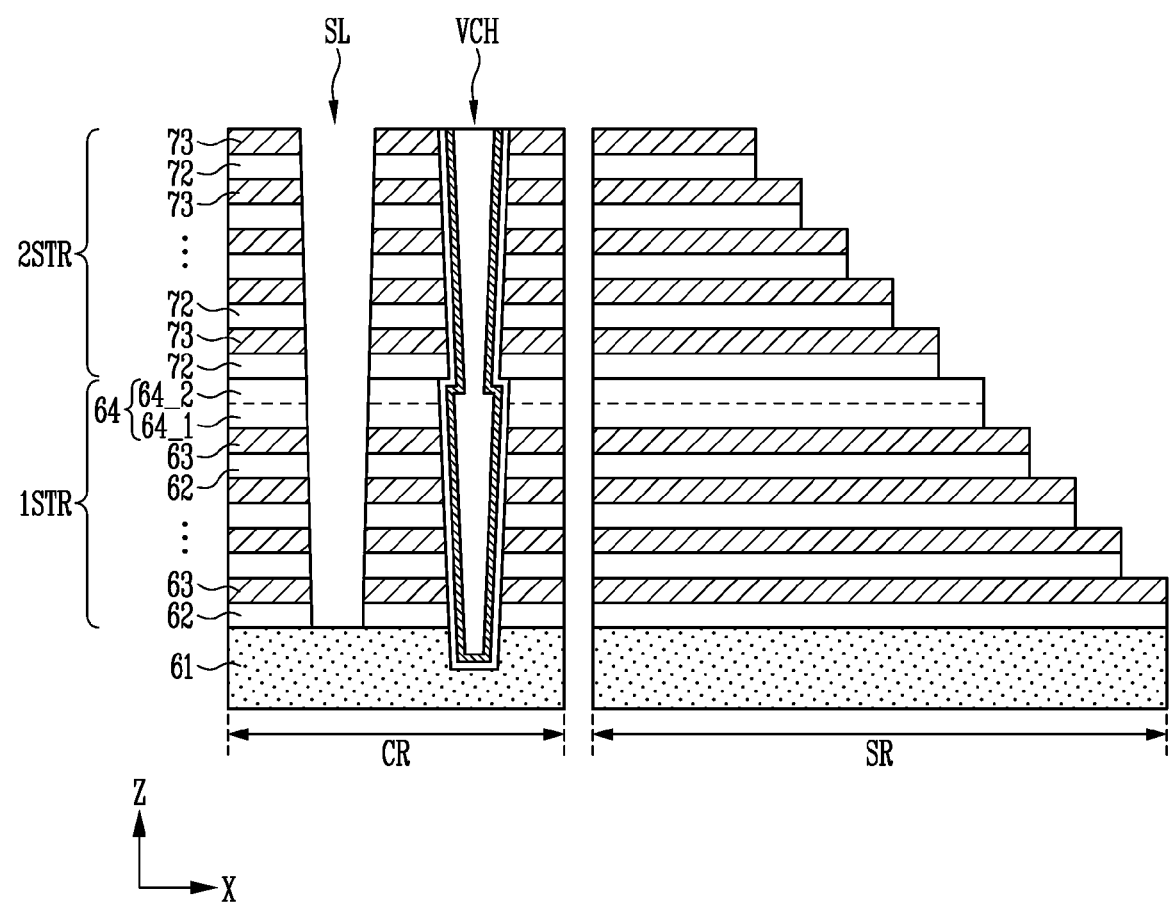

Referring to FIG. 15, a slit SL that vertically separates the first and second stack structures 1STR and 2STR may be formed. For example, the slit SL may be formed by performing an etching process for vertically removing a portion of the first and second stack structures 1STR and 2STR formed in the cell region. The etching process for forming the slit SL may be performed until a portion of the lower structure 61 is exposed. When the slit SL is formed in the cell region CR, the first to fifth material layers 61, 62, 64_1, 64_2, 72, and 73 may be exposed along an inner wall of the slit SL.

Figure 16:
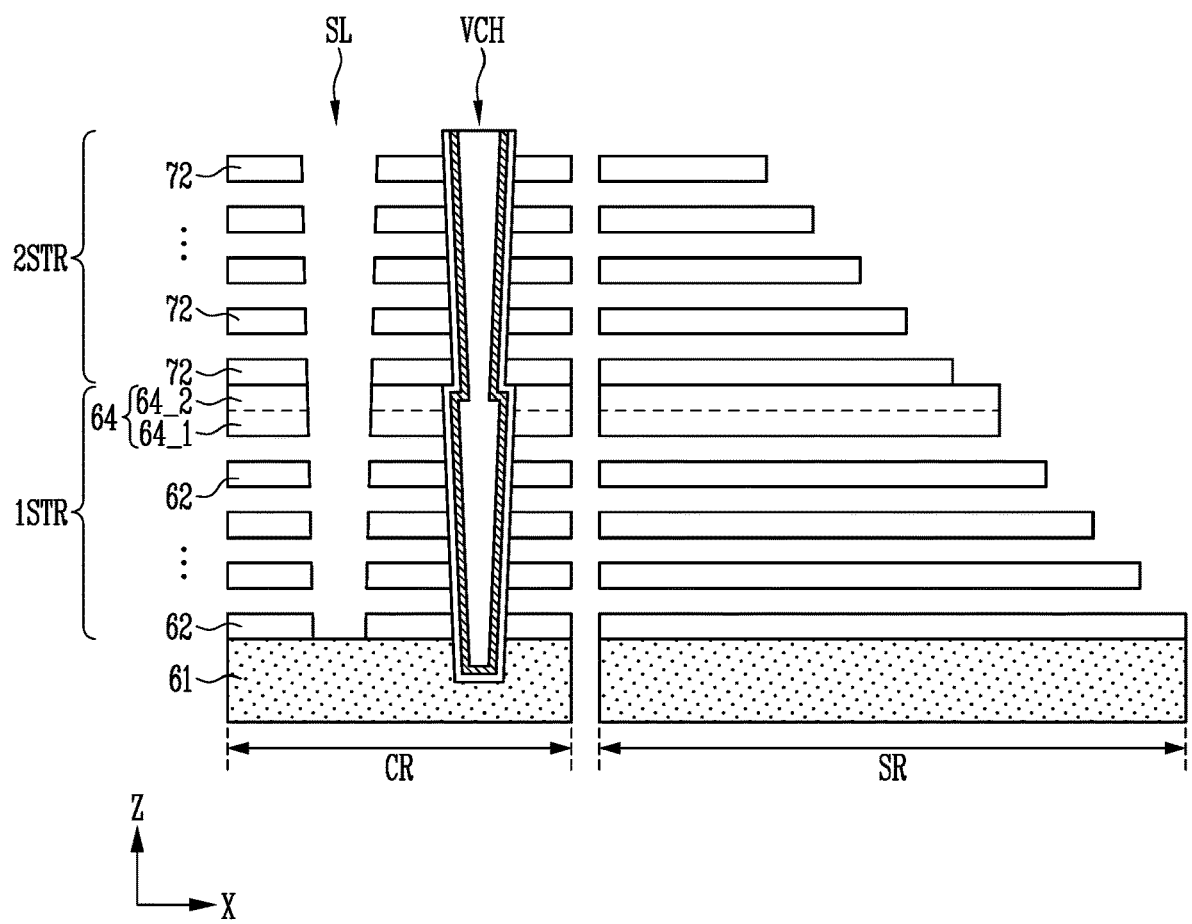

Referring to FIG. 16, an etching process for selectively removing the second and fifth material layers 63 and 73 exposed through the slit SL may be performed. For example, a wet etching process may be performed to selectively remove the second and fifth material layers 63 and 73 formed in the first and second stack structures 1STR and 2STR.

Figure 17:
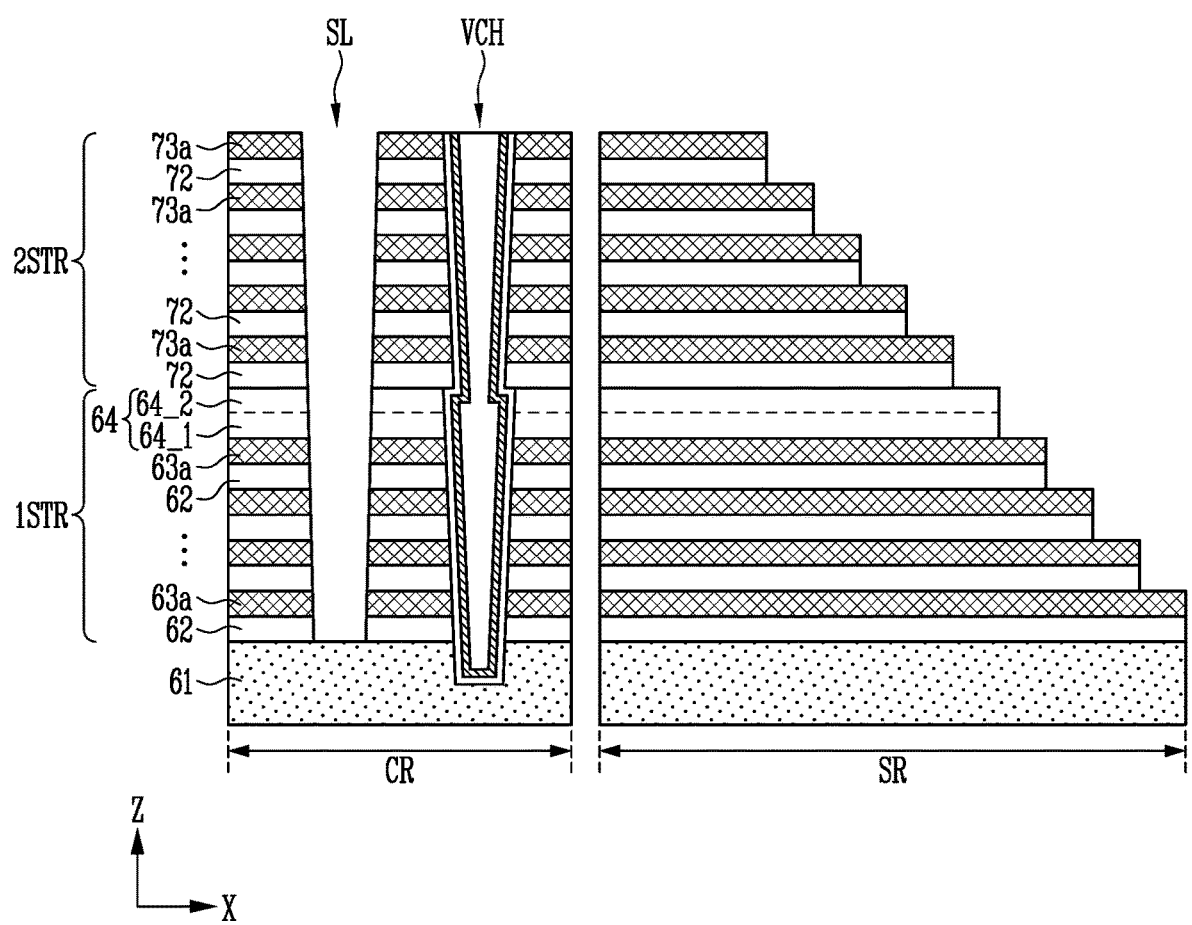

Referring to FIG. 17, conductive layers 63a and 73a for gate lines may be filled in a region from which the second and fifth material layers 63 and 73 are removed. Since the conductive layers 63a and 73a may be used as the word line or the selection line, the conductive layers 63a and 73a may be formed of at least one layer among tungsten (W), cobalt (Co), nickel (Ni), molybdenum (Mo), silicon (Si), and polysilicon (poly-Si). In an embodiment, gate lines included in the second stack structure 2STR may be referred to as second gate lines and gate lines included in the first stack structure 1STR may be referred to as first gate lines. In an embodiment, interlayer insulating layers may be formed between the first gate lines and between the second gate lines. For example, in an embodiment, first material layers 62 may be interlayer insulating layers formed between the first gate lines and fourth material layers 72 may be interlayer insulating layers formed between the second gate lines.

Figure 18:
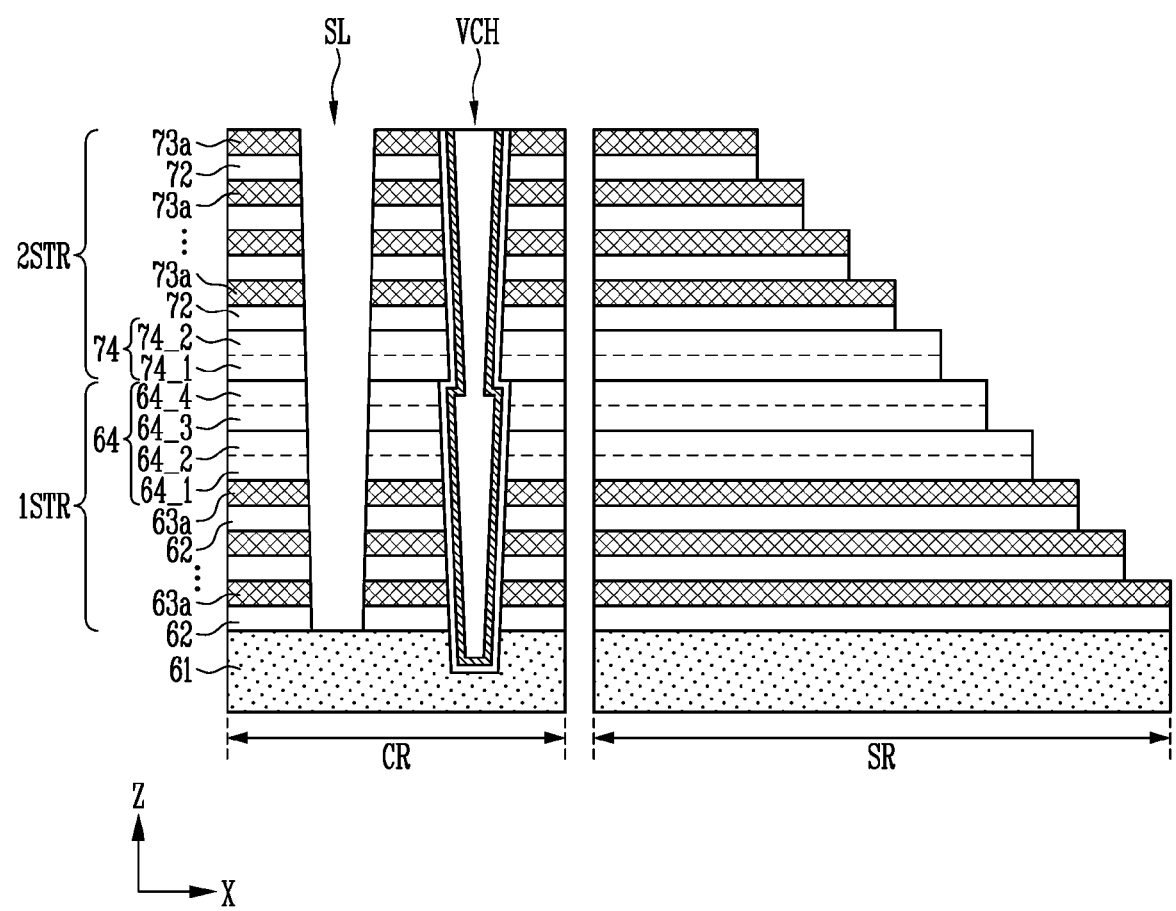
FIG. 18 is a diagram illustrating a structure according to a second embodiment of the present disclosure.

FIG. 18 is a diagram illustrating a structure according to a second embodiment of the present disclosure.

Referring to FIG. 18, a double stack structure in which a first stack structure 1STR and a second stack structure 2STR are stacked on a lower structure 61 in which a cell region CR and a slimming region SR are defined may be formed. For example, the first stack structure 1STR may include first material layers 62, conductive layers 63a, and a first interlayer insulating structure 64 alternately stacked on the lower structure 61. The first interlayer insulating structure 64 may be formed on an uppermost end of the first stack structure 1STR, and may include third material layers 64_1 to 64_4 stacked on each other. The first material layers 62 and the first interlayer insulating structure 64 may be formed of the same material. For example, the first material layers 62 and the first interlayer insulating structure 64 may be formed of an oxide layer. The conductive layers 63a may be used as a word line or a selection line in the memory block, and may be formed of at least one layer among tungsten (W), cobalt (Co), nickel (Ni), molybdenum (Mo), silicon (Si), and polysilicon (poly-Si).

The second stack structure 2STR may be formed on the first interlayer insulating structure 64. For example, the second stack structure 2STR may include a second interlayer insulating structure 74 stacked on the first interlayer insulating structure 64, and fourth material layers 72 and conductive layers 73a alternately stacked. The second interlayer insulating structure 74 may be formed at a lowermost end of the second stack structure 2STR, and may include sixth material layers 74_1 and 74_2 stacked on each other. The sixth material layers 74_1 and 74_2 may be formed of the same material as the third material layers 64_1 to 64_4, the fourth material layers 72 may be formed of the same material as the first material layers 62, and the conductive layers 73a may be formed of the same material as the conductive layers 63a. In addition, the fourth material layers 72 and the second interlayer insulating structure 74 may be formed of the same material. For example, the fourth material layers 72 and the second interlayer insulating structure 74 may be formed of an oxide layer. The conductive layers 73a may be used as the word line or the selection line in the memory block, and may be formed of at least one layer among tungsten (W), cobalt (Co), nickel (Ni), molybdenum (Mo), silicon (Si), and polysilicon (poly-Si).

In the slimming region SR, an edge of the first stack structure 1STR including the first interlayer insulating structure 64 and the second stack structure 2STR including the second interlayer insulating structure 74 may be formed in a successive step shape.

At least one or more vertical plugs VCH vertically passing through the first and second stack structures 1STR and 2STR may be included in the cell region CR. Since a portion of the vertical plug VCH formed in the first stack structure 1STR is formed before a portion formed in the second stack structure 2STR, in a region where the first and second stack structures 1STR and 2STR are in contact with each other, a pattern of the vertical plug VCH may be rapidly changed. For example, a width of a lower end of the vertical plug VCH formed in the first stack structure 1STR may be narrower than a width of an upper end, and a width of a lower end of the vertical plug VCH formed in the second stack structure 2STR may be narrower than a width of an upper end. Since a portion where the width of the vertical plug VCH of the first stack structure 1STR is widest and a portion where the width of the vertical plug VCH of the second stack structure 2STR is narrowest are in contact with each other, a pattern change of the vertical plug VCH may be great in a region where portions where the widths are different from each other are in contact with each other.

As described above, when a gate line is formed in a region where the pattern change of the vertical plug VCH is great, a bridge may occur between the vertical plug VCH and the gate line due to a characteristic of a manufacturing process.

Therefore, in the second embodiment, the first interlayer insulating structure 64 may be formed on an upper end of the first stack structure 1STR so that the vertical plug VCH and the gate line do not overlap each other in the region where the pattern change of the vertical plug VCH is great, and the second interlayer insulating structure 74 that is in contact with the first interlayer insulating structure 64 may be formed at a lower end of the second stack structure 2STR. The first interlayer insulating structure 64 may be formed to be thicker than a thickness of each of the first material layers 62 of the first stack structure 1STR and a thickness of each of the fourth material layers 72 of the second stack structure 2STR and the second interlayer insulating structure 74 may be formed to be thicker than the thickness of each of the first material layers 62 of the first stack structure 1STR and the thickness of each of the fourth material layers 72 of the second stack structure 2STR, so that the region where the pattern change of the vertical plug VCH is great may be sufficiently included in the first interlayer insulating structure 64 and the second interlayer insulating structure 74.

Figure 19:
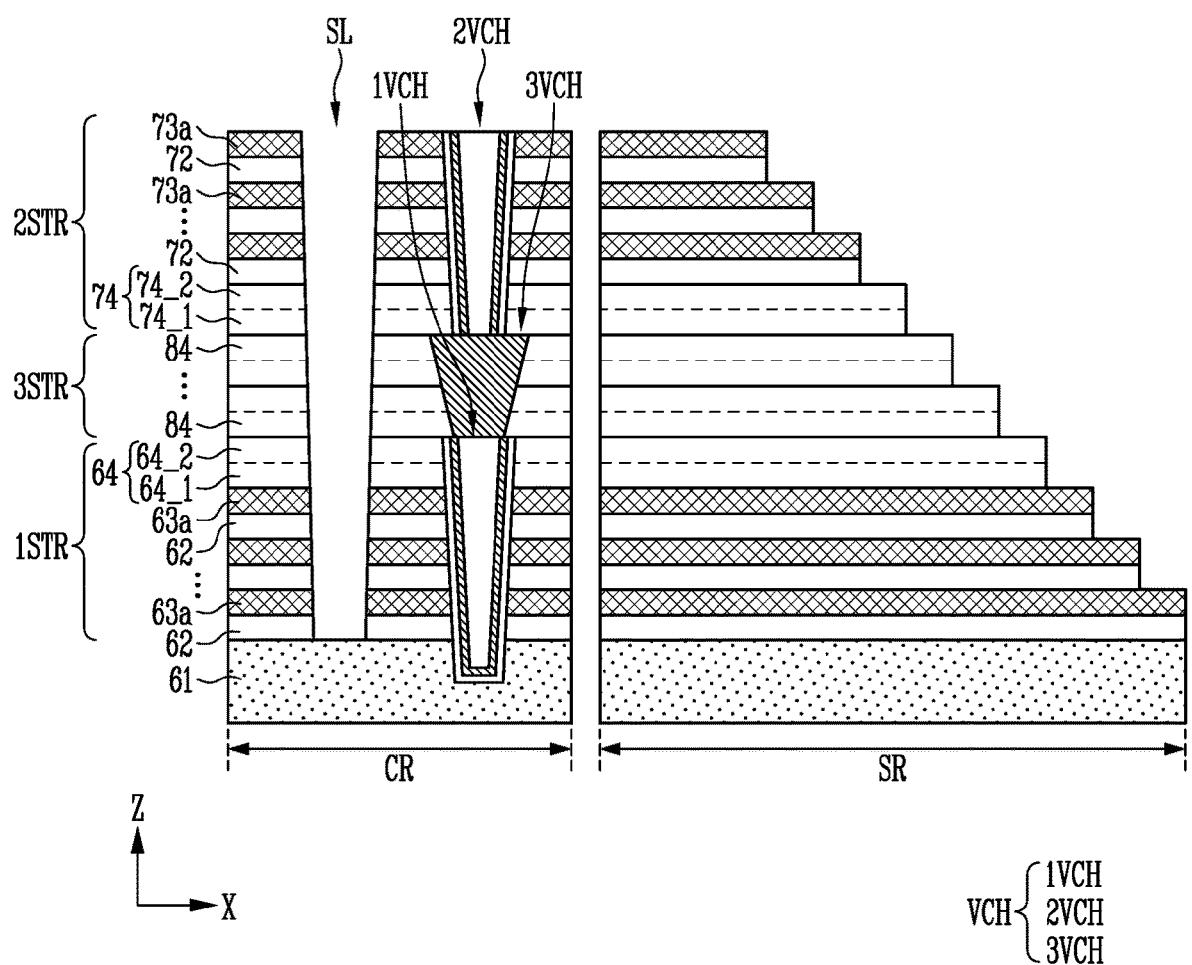
FIG. 19 is a diagram illustrating a structure according to a third embodiment of the present disclosure.

FIG. 19 is a diagram illustrating a structure according to a third embodiment of the present disclosure.

Referring to FIG. 19, a multi stack structure in which a first stack structure 1STR, a third interlayer insulating structure 3STR, and a second stack structure 2STR are formed on a lower structure 61 in which a cell region CR and a slimming region SR are defined is shown.

For example, the first stack structure 1STR may include first material layers 62, conductive layers 63a, and a first interlayer insulating structure 64 alternately stacked on the lower structure 61. The first interlayer insulating structure 64 may be formed on an uppermost end of the first stack structure 1STR, and may include third material layers 64_1 and 64_2 stacked on each other. The first material layers 62 and the first interlayer insulating structure 64 may be formed of the same material. For example, the first material layers 62 and the first interlayer insulating structure 64 may be formed of an oxide layer. The conductive layers 63a may be used as a word line or a selection line in the memory block, and may be formed of at least one layer among tungsten (W), cobalt (Co), nickel (Ni), molybdenum (Mo), silicon (Si), and polysilicon (poly-Si).

The third interlayer insulating structure 3STR may be formed on the first interlayer insulating structure 64. For example, the third interlayer insulating structure 3STR may include seventh material layers 84 stacked on each other on the first interlayer insulating structure 64. The seventh material layers 84 may be formed of the same material as the first material layers 62 or the third material layers 64_1 and 64_2. For example, the seventh material layers 84 may be formed of an oxide layer.

The second stack structure 2STR may be formed on the third interlayer insulating structure 3STR. For example, the second stack structure 2STR may include a second interlayer insulating structure 74 stacked on the third interlayer insulating structure 3STR, and fourth material layers 72 and conductive layers 73a alternately stacked. The second interlayer insulating structure 74 may be formed at a lowermost end of the second stack structure 2STR, and may include sixth material layers 74_1 and 74_2 stacked on each other. The sixth material layers 74_1 and 74_2 may be formed of the same material as the third material layers 64_1 and 64_2 or the seventh material layers 84, the fourth material layers 72 may be formed of the same material as the first material layers 62, and the conductive layers 73a may be formed of the same material as the conductive layers 63a. In addition, the fourth material layers 72 and the second interlayer insulating structure 74 may be formed of the same material. For example, the fourth material layers 72 and the second interlayer insulating structure 74 may be formed of an oxide layer. The conductive layers 73a may be used as the word line or the selection line in the memory block, and may be formed of at least one layer among tungsten (W), cobalt (Co), nickel (Ni), molybdenum (Mo), silicon (Si), and polysilicon (poly-Si).

In the slimming region SR, an edge of the first stack structure 1STR including the first interlayer insulating structure 64, the third interlayer insulating structure 3STR, and the second stack structure 2STR including the second interlayer insulating structure 74 may be formed in a successive step shape.

In the cell region CR, at least one or more first vertical plugs 1VCH vertically passing through the first stack structure 1STR, at least one or more third vertical plugs 3VCH formed on the first vertical plugs and vertically passing through the third interlayer insulating structure 3STR, and at least one or more second vertical plugs 2VCH formed on the third vertical plugs 3VCH and vertically passing through the second stack structure 2STR may be included. Since the first vertical plug 1VCH is formed before the third vertical plug 3VCH, and the third vertical plug 3VCH is formed before the second vertical plug 2VCH, a pattern of the vertical plug VCH may be rapidly changed in a region where the first stack structure 1STR and the third interlayer insulating structure 3STR are in contact with each other and in a region where the third interlayer insulating structure 3STR and the second stack structure 2STR are in contact with each other. For example, a width of a lower end of the first vertical plug 1VCH may be narrower than a width of an upper end, a width of a lower end of the third vertical plug 3VCH may be narrower than a width of an upper end, and a width of a lower end of the second vertical plug 2VCH may be narrower than a width of an upper end. Since a portion where a width of the first vertical plug 1VCH is widest and a portion where a width of the third vertical plug 3VCH is narrowest are in contact with each other, and a portion where the width of the third vertical plug 3VCH is widest and a portion where a width of the second vertical plug 2VCH is narrowest are in contact with each other, a pattern change of the vertical plug VCH may be great in a region where portions where widths are different from each other are in contact with each other. In an embodiment, the third vertical plug 3VCH may be a channel connection structure.

As described above, when the gate line is formed in the region where the pattern change of the vertical plug VCH is great, a bridge may occur between the vertical plug VCH and the gate line due to a characteristic of a manufacturing process.

Therefore, in the third embodiment, the first interlayer insulating structure 64, the third interlayer insulating structure 3STR, and the second interlayer insulating structure 74 may be formed so that the vertical plug VCH and the gate line do not overlap each other in the region where the pattern change of the vertical plug VCH is great. The first interlayer insulating structure 64 may be formed to be thicker than a thickness of each of the first material layers 62 of the first stack structure 1STR, the third interlayer insulating structure 3STR may be formed to be thicker than the thickness of each of the first material layers 62 of the first stack structure 1STR, and the second interlayer insulating structure 74 may be formed to be thicker than the thickness of each of the first material layers 62 of the first stack structure 1STR.

The third vertical plug 3VCH may be formed of the same material as a channel layer of the first vertical plugs 1VCH and a channel layer of the second vertical plug 2VCH. Therefore, the channel layer of the first vertical plugs 1VCH, the channel layer of the second vertical plug 2VCH, and the third vertical plug 3VCH may be electrically connected to each other. A lower width of the third vertical plug 3VCH may be equal to or wider than an upper width of the channel layer included in the first vertical plugs 1VCH. An upper width of the third vertical plug 3VCH may be wider than a lower width of the channel layer included in the second vertical plug 2VCH.

A method of manufacturing the semiconductor memory device according to the third embodiment shown in FIG. 19 is described as follows.

FIGS. 20 to 30 are diagrams illustrating the method of manufacturing the semiconductor memory device according to the third embodiment of the present disclosure.

Figure 20:
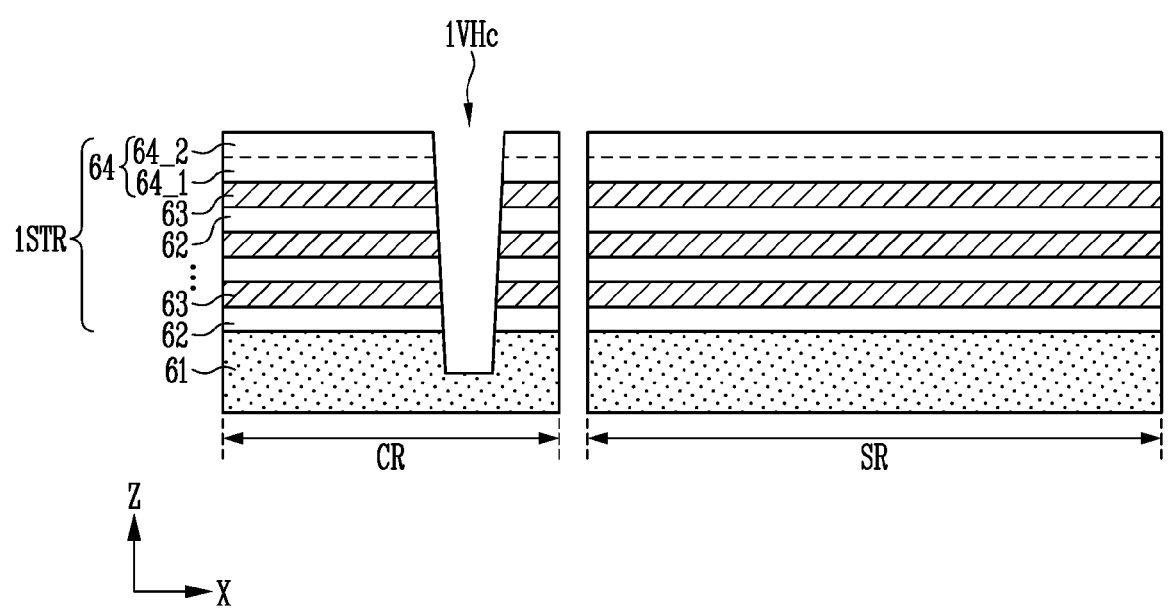
FIGS. 20, 21, 22, 23, 24, 25, 26, 27, 28, 29, and 30 are diagrams illustrating a method of manufacturing the semiconductor memory device according to the third embodiment of the present disclosure.

Referring to FIG. 20, the first stack structure 1STR may be formed on the lower structure 61 in which the cell region CR and the slimming region SR are defined. The lower structure 61 may be a semiconductor substrate or may include a structure corresponding to peripheral circuits formed on the semiconductor substrate.

The first stack structure 1STR may include first and second material layers 62 and 63 alternately stacked. The first material layers 62 may be for insulating gate electrodes to be formed in a subsequent process from each other, and the second material layers 63 may be for forming a gate electrode of a memory cell, a selection transistor, or the like. The first and second material layers 62 and 63 may be formed of materials having the same or similar etch selectivity. For example, the second material layers 63 may be sacrificial layers including nitride or the like, and the first material layers 62 may be insulating layers including oxide or the like.

The first interlayer insulating structure 64 may be formed on the uppermost end of the first stack structure 1STR. The first interlayer insulating structure 64 may include at least two or more third material layers 64_1 and 64_2. Although the two third material layers 64_1 and 64_2 are shown in FIG. 20 as an example, the number of third material layers 64_1 and 64_2 included in the first interlayer insulating structure 64 is not limited to the number shown in the drawing. The third material layers 64_1 and 64_2 may be formed of the same material as the first material layers 62. For example, the third material layers 64_1 and 64_2 may be for insulating stacked gate electrodes from each other, and may be, for example, an insulating layer including oxide or the like.

At least one first vertical hole 1VHc vertically passing through the first stack structure 1STR may be formed in the cell region CR of the first stack structure 1STR. For example, the first vertical hole 1VHc may be formed in a method of forming a mask pattern (not shown) in which an opening is formed on the third material layer 64_2 formed at the uppermost end of the first stack structure 1STR of the cell region CR and etching the first stack structure 1STR exposed through the opening. The etching process may be performed until the lower structure 61 is exposed. The first vertical hole 1VHc formed in the cell region CR may be formed to form the first vertical plugs 1VCH.

Figure 21:
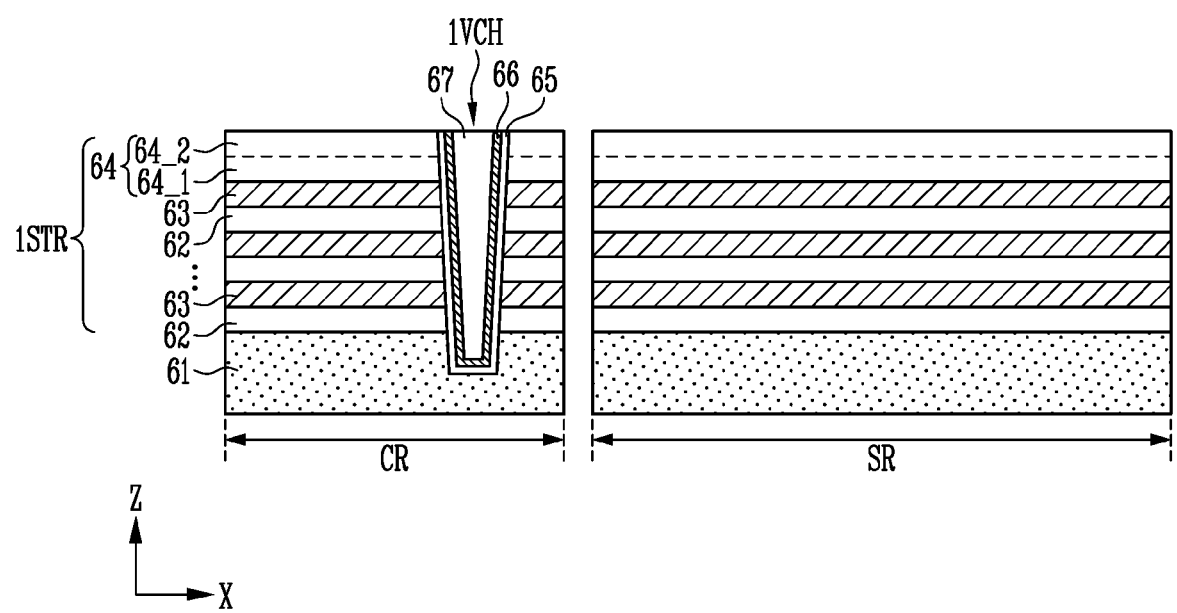

Referring to FIG. 21, the first vertical plug 1VCH may be formed in the first vertical hole 1VHc. Materials configuring the first vertical plug 1VCH may be used as a memory cell.

The first vertical plug 1VCH may include a memory layer 65, a channel layer 66, and a vertical insulating layer 67 sequentially formed along an inner wall of the first vertical hole 1VHc.

The memory layer 65 may be formed in a cylindrical shape along the inner wall of the first vertical hole 1VHc. The channel layer 66 may be formed in a cylindrical shape along an inner wall of the memory layer 65 and may be formed of polysilicon. The vertical insulating layer 67 may be formed in a cylindrical shape filling an inside of the channel layer 66, and may be formed of an insulating layer including oxide or the like. Although not shown in the drawing, according to an embodiment, the channel layer 66 may be formed in a cylindrical shape, and in this case, the vertical insulating layer 67 might not be formed.

Figure 22:
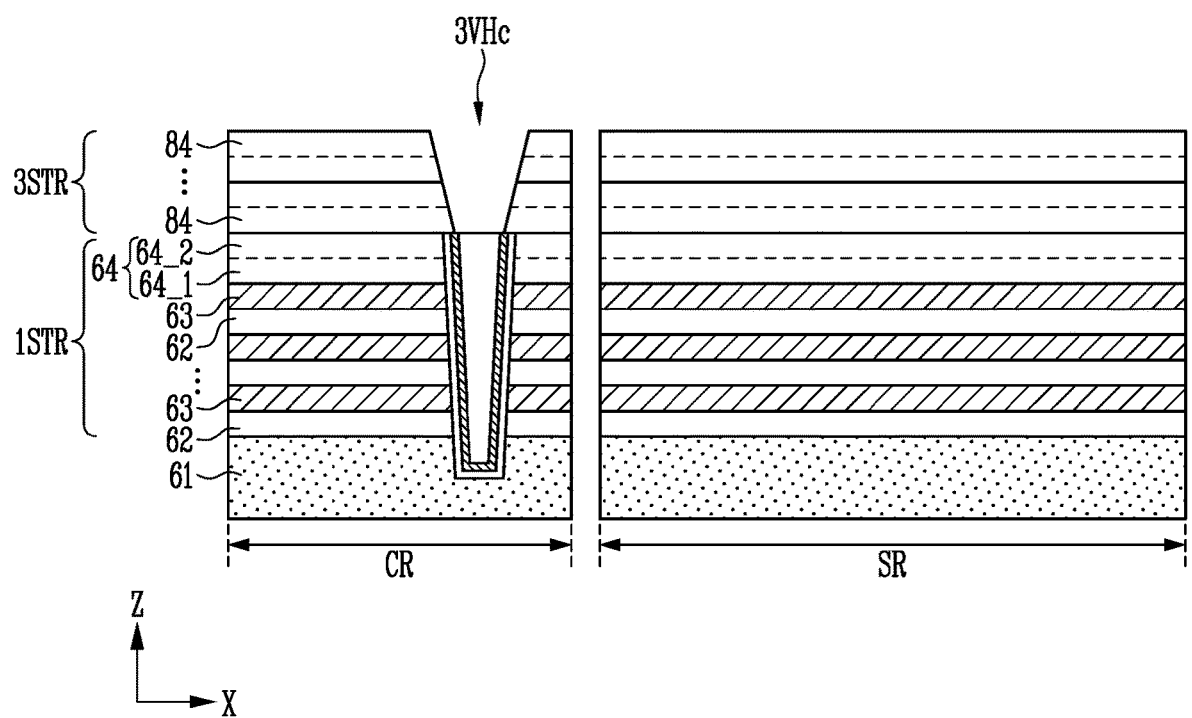

Referring to FIG. 22, the third interlayer insulating structure 3STR may be formed on the first stack structure 1STR. The third interlayer insulating structure 3STR may include at least two seventh material layers 84. Although four seventh material layers 84 are shown in FIG. 22 as an example, the number of seventh material layers 84 included in the third interlayer insulating structure 3STR is not limited to the number shown in the drawing. The seventh material layers 84 may be formed of the same material as the first material layers 62 or the third material layers 64_1 and 64_2. For example, the seventh material layers 84 may be for insulating stacked gate electrodes from each other, and may be, for example, an insulating layer including oxide or the like.

At least one third vertical hole 3VHc vertically passing through the third interlayer insulating structure 3STR may be formed on the first plug 1VCH in the cell region CR of the third interlayer insulating structure 3STR. For example, the third vertical hole 3VHc may be formed in a method of forming a mask pattern (not shown) in which an opening is formed on the seventh material layers 84 formed on an uppermost end of the third interlayer insulating structure 3STR of the cell region CR and etching the third interlayer insulating structure 3STR exposed through the opening. At this time, the opening may be formed on the first vertical plug 1VCH. The etching process may be performed until the first vertical plug 1VCH is exposed.

Figure 23:
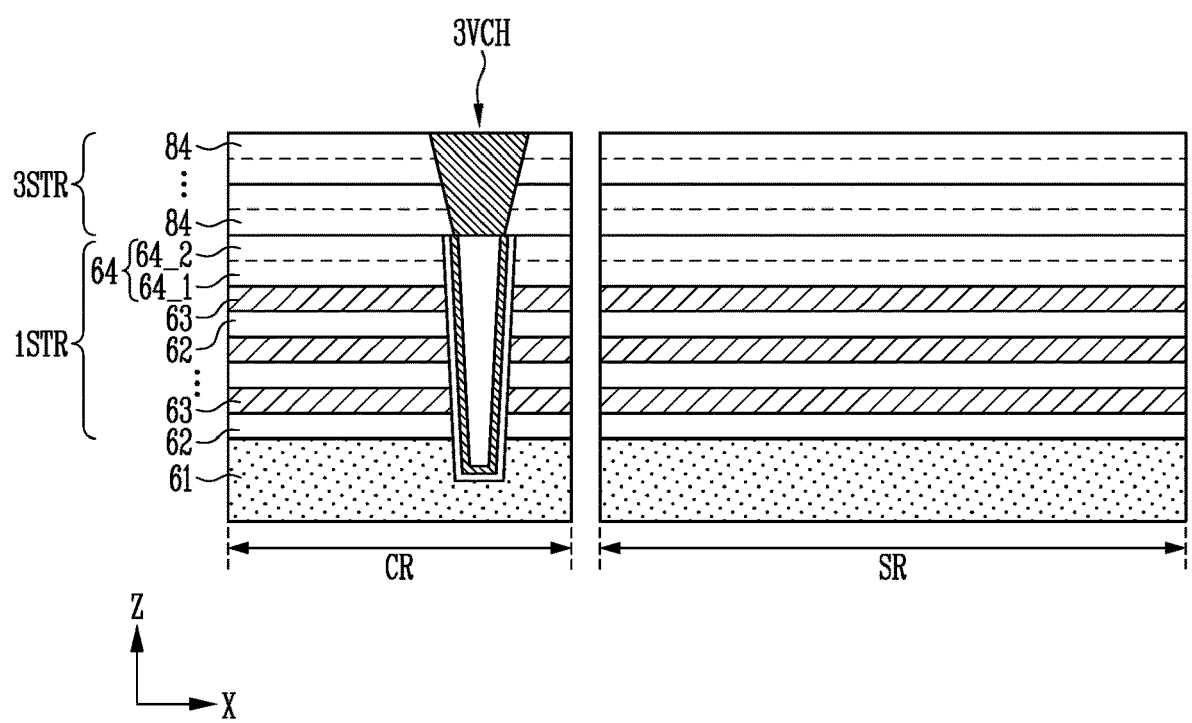

Referring to FIG. 23, the third vertical plug 3VCH may be formed in the third vertical hole 3VHc.

The third vertical plug 3VCH may include a channel layer filling an inside of the third vertical hole 3VHc. Although not shown in the drawing, a memory layer (not shown) may be further formed along an outer wall of the third vertical plug 3VCH according to an embodiment.

The third vertical plug 3VCH may electrically connect the channel layer of the first vertical plug 1VCH and a channel layer of the second vertical plug 2VCH to be described later.

Figure 24:
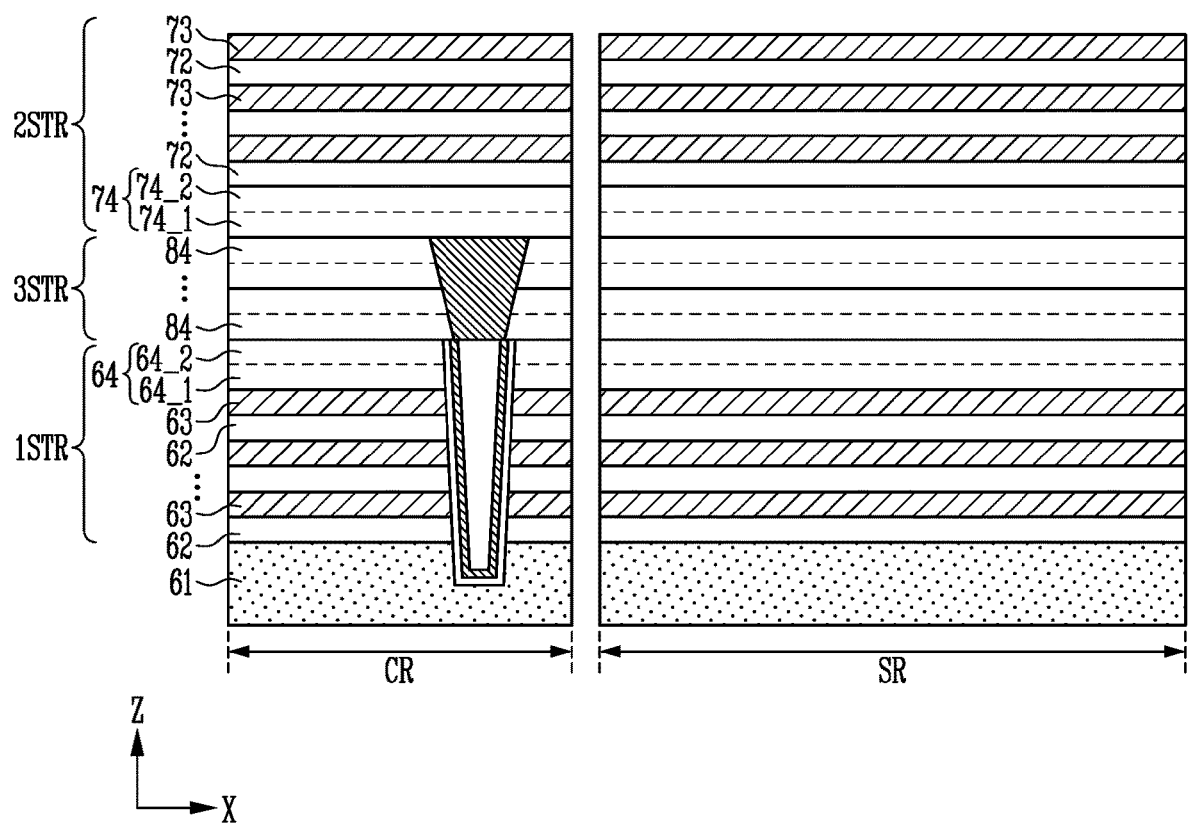

Referring to FIG. 24, the second stack structure 2STR may be formed on the third interlayer insulating structure 3STR in which the third vertical plug 3VCH is formed. The second stack structure 2STR may include the second interlayer insulating structure 74 in which the sixth material layers 74_1 and 74_2 are stacked on each other and the fourth and fifth material layers 72 and 73 alternately stacked. For example, the sixth material layers 74_1 and 74_2 may be formed of the same material as the third material layers 64_1 and 64_2 of the first stack structure 1STR or the seventh material layers 84 of the third interlayer insulating structure 3STR, the fourth material layers 72 may be formed of the same material as the first material layers 62 of the first stack structure 1STR, and the fifth material layers 73 may be formed of the same material as the second material layers 63 of the first stack structure 1STR.

The second interlayer insulating structure 74 may be formed at a lowermost end of the second stack structure 2STR. The second interlayer insulating structure 64 may include at least one odd number of sixth material layers 74_1, 742 . . . . Although two sixth material layers 74_1 and 74_2 are shown in FIG. 24 as an example, the number of sixth material layers 74_1 and 74_2 included in the second interlayer insulating structure 74 is not limited to the number shown in the drawing. The sixth material layers 74_1 and 74_2 may be formed of the same material as the fourth material layers 72. For example, the sixth material layers 74_1 and 74_2 may be for insulating the stacked gate electrodes from each other, and may be, for example, an insulating layer including oxide or the like.

Figure 25:
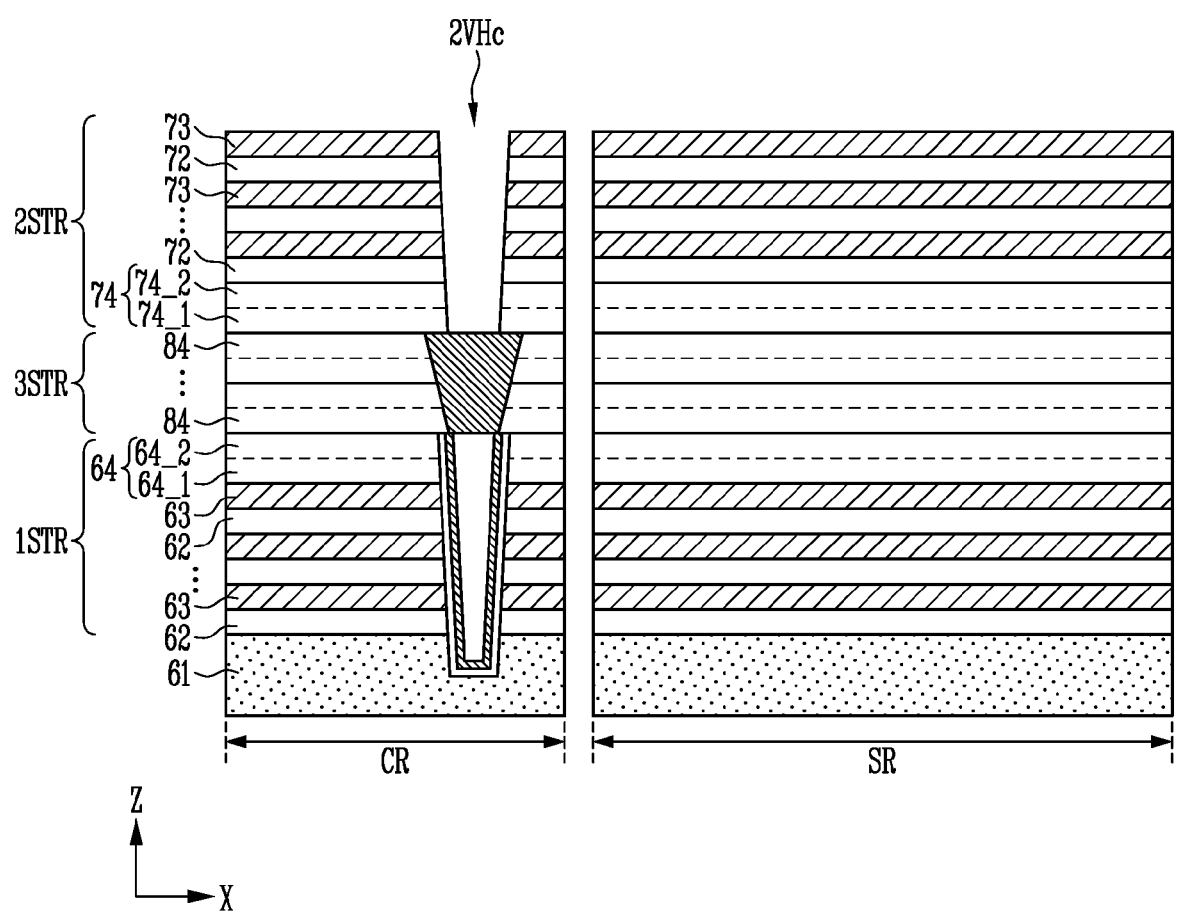

Referring to FIG. 25, in the cell region CR of the second stack structure 2STR, at least one second vertical hole 2VHc vertically passing through the second stack structure 2STR may be formed on the third plug 3VCH. For example, the second vertical hole 2VHc may be formed in a method of forming a mask pattern (not shown) in which an opening is formed on the fifth material layers 73 formed at an uppermost end of the second stack structure 2STR of the cell region CR and etching the second stack structure 2STR exposed through the opening. At this time, the opening may be formed on the third vertical plug 3VCH. The etching process may be performed until the third vertical plug 3VCH is exposed. The second vertical hole 2VHc formed in the cell region CR may be formed to form the second vertical plugs 2VCH.

Figure 26:
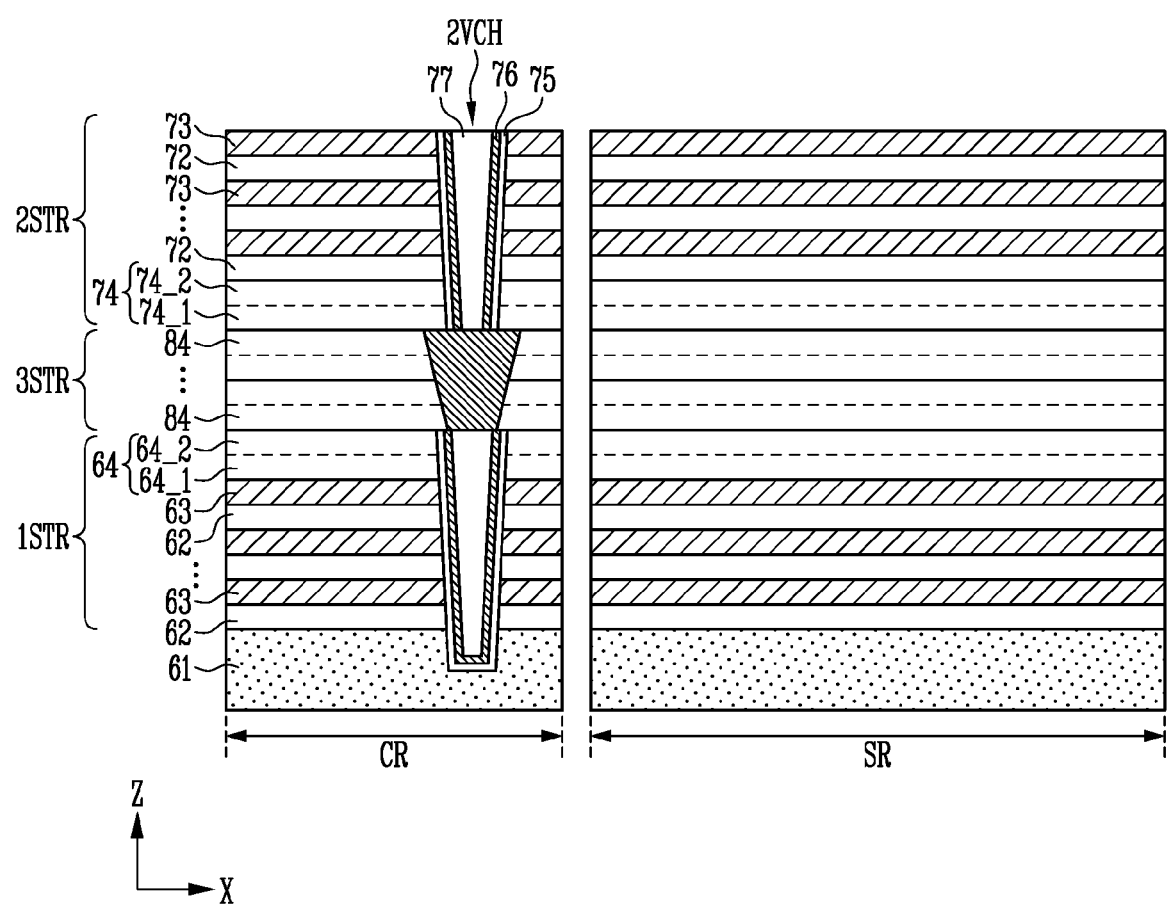

Referring to FIG. 26, the second vertical plug 2VCH may be formed in the second vertical hole 2VHc. Materials configuring the second vertical plug 2VCH may be used as the memory cell.

The second vertical plug 2VCH may include a memory layer 75, a channel layer 76, and a vertical insulating layer 77 sequentially formed along an inner wall of the second vertical hole 2VHc.

The memory layer 75 may be formed in a cylindrical shape along the inner wall of the second vertical hole 2VHc. The channel layer 76 may be formed in a cylindrical shape along an inner wall of the memory layer 75 and may be formed of polysilicon. The vertical insulating layer 77 may be formed in a cylindrical shape filling an inside of the channel layer 76, and may be formed of an insulating layer including oxide or the like. Although not shown in the drawing, according to an embodiment, the channel layer 76 may be formed in a cylindrical shape, and in this case, the vertical insulating layer 77 might not be formed.

Since the second vertical plug 2VCH is formed on the third vertical plug 3VCH, the channel layer 76 included in the second vertical plug 2VCH may be electrically connected to the channel layer included in the first vertical plug through the third vertical plug 3VCH.

Figure 27:
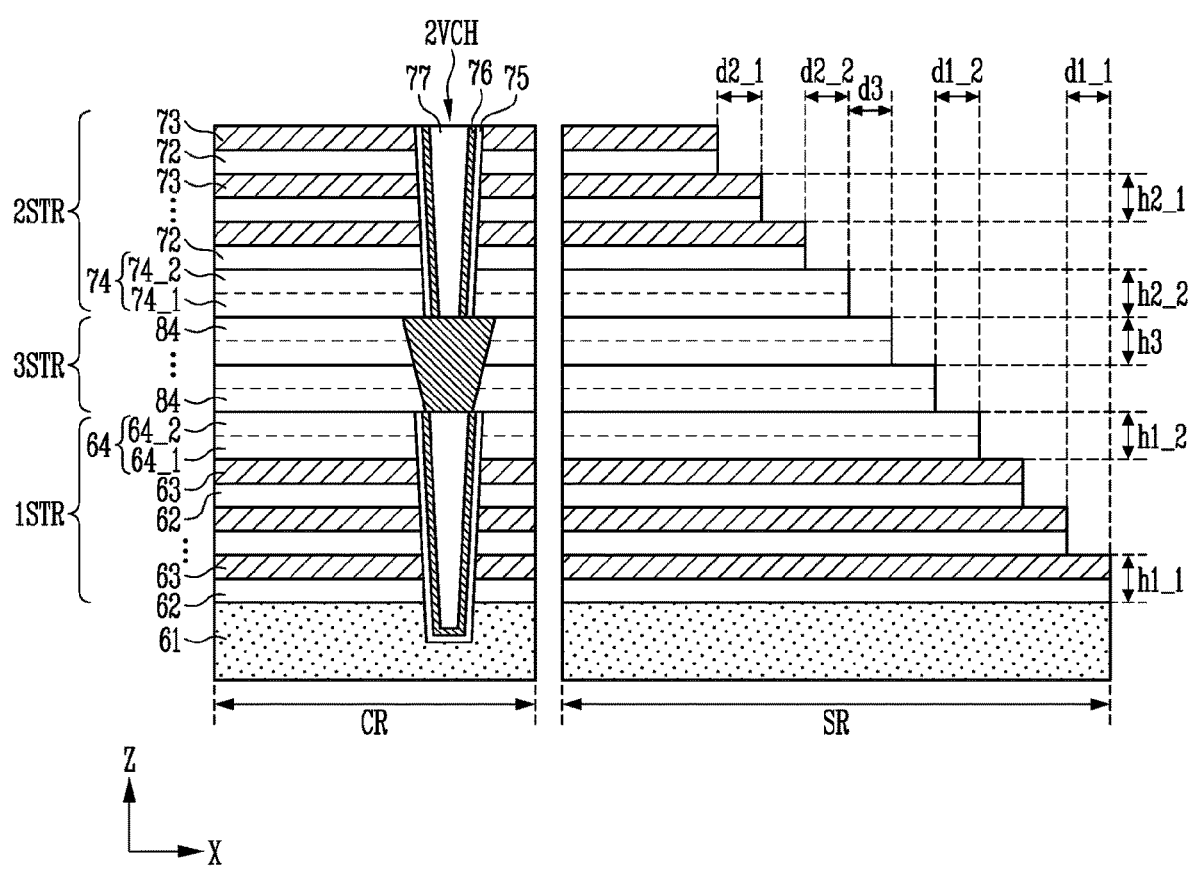

Referring to FIG. 27, a slimming process may be performed to expose each of the second, third, fifth, and seventh material layers 63, 64_2, 73, and 84 in the slimming region SR. More specifically, the slimming process may include etching processes sequentially using a plurality of mask patterns in order to form a plurality of step shapes in which the first and second material layers 62 and 63 formed in the slimming region SR are paired, a plurality of step shapes in which the third material layers 64_1 and 64_2 are paired, a plurality of step shapes in which the seventh material layers 84 are paired, a plurality of step shapes in which the sixth material layers 74_1 and 74_2 are paired, a plurality of step shapes in which the sixth and fifth material layers 74 and 73 are paired, and a plurality of step shapes in which the fourth and fifth material layers 72 and 73 are paired.

Although not shown in the drawing, a first mask pattern may be formed in the entire cell region CR and a portion of the slimming region SR. The first mask pattern may include a first opening exposing a material to be etched in the slimming region SR. For example, the first mask pattern may be formed to cover the entire cell region CR and the portion of the slimming region SR. That is, a portion of the fifth material layer 73 formed at an uppermost end among the first to seventh material layers 62, 63, 64_1, 64_2, 72, 73, 74_1, 74_2, and 84 may be exposed through the first opening of the first mask pattern.

An etching process for removing the fifth and fourth material layers 73 and 72 of the uppermost end exposed through the first opening may be performed. The etching process may be performed as an anisotropic etching process so that only a material exposed through the first opening may be removed. The etching process using the first mask pattern may be performed until the fifth material layer 73 positioned under the fourth material layer 72 removed from the slimming region SR is exposed.

When the fifth material layer 73 is exposed in the slimming region SR, the first mask pattern may be removed and a second mask pattern including a second opening may be formed. In order to form a step shape, the second mask pattern may include the second opening narrower than the first opening. For example, the second mask pattern may be formed to cover the entire cell region CR and a portion of the slimming region SR. That is, a portion the fifth and fourth material layers 73 and 72 formed at the uppermost end among the first to seventh material layers 62, 63, 64_1, 64_2, 72, 73, 74_1, and 74_2 exposed through the second opening of the second mask pattern may be exposed.

An etching process for removing the fifth and fourth material layers 73 and 72 of the uppermost end exposed through the second opening may be performed. The etching process may be performed as an anisotropic etching process so that only a material exposed through the second opening may be removed. The etching process using the second mask pattern may be performed until the fifth material layer 73 positioned under the fourth material layer 72 removed from the slimming region SR is exposed.

Subsequently, the second mask pattern may be removed, and an etching process sequentially using mask patterns in which the area of an opening is narrowed according to the above-described mask pattern formation and etching may be performed to form a successive step shape in the slimming region SR. For example, in the slimming region SR, a step shape in which the fifth, seventh, third, and second material layers 73, 84, 64_2, and 63 are exposed in each layer may be formed.

The slimming process may be performed so that the edge of the first stack structure 1STR, the third interlayer insulating structure 3STR, and the second stack structure 2STR form a step shape, and an edge of a portion except for the first interlayer insulating structure 64 in the first stack structure 1STR may be formed to have constant height $h1\_1$ and constant distance $d1\_1$ and an edge of a portion except for the second interlayer insulating structure 74 in the second stack structure 2STR may be formed to have constant height $h2\_1$ and constant distance $d2\_1$. In addition, the height h1_1 or the distance d1_1 of the edge of the portion except for the first interlayer insulating structure 64 in the first stack structure 1STR may be different from the height h1_2 or the distance d1_2 of the edge of the first interlayer insulating structure 64 due to selectivity between materials, and the height h2_1 or the distance d2_1 of the edge of the portion except for the second interlayer insulating structure 74 in the second stack structure 2STR may be different from the height h2_2 or the distance d2_2 of the edge or the second interlayer insulating structure 74 due to selectivity between materials, but the disclosure is not limited thereto. The height h1_2 and distance d1_2 of the edge of the first interlayer insulating structure 64 and the height h2_2 and distance d2_2 of the edge of the second interlayer insulating structure 74 may be formed constant, and an edge of the third interlayer insulating structure 3STR may be formed to have constant height h3 and constant distance d3 with the edges of the first interlayer insulating structure 64 and the second interlayer insulating structure 74. In addition, the height h3 or the distance d3 of the edge of the third interlayer insulating structure 3STR may be different from the height h1_1 or the distance d1_1 of the edge of the portion except for the first interlayer insulating structure 64 in the first stack structure 1STR and the height h3 or the distance d3 of the edge of the third interlayer insulating structure 3STR may be different from the height h2_1 or the distance d2_1 of the edge of the portion except for the second interlayer insulating structure 74 in the second stack structure 2STR due to selectivity between material, but the disclosure is not limited thereto.

When the slimming process is ended, an interlayer insulating layer (not shown) may be formed on the cell region CR and the slimming region SR, and contact plugs (not shown) which are in contact with each of the second and fifth material layers 63 and 73 of the slimming region SR may be formed. The interlayer insulating layer may be formed of an insulating layer including oxide or the like.

Figure 28:
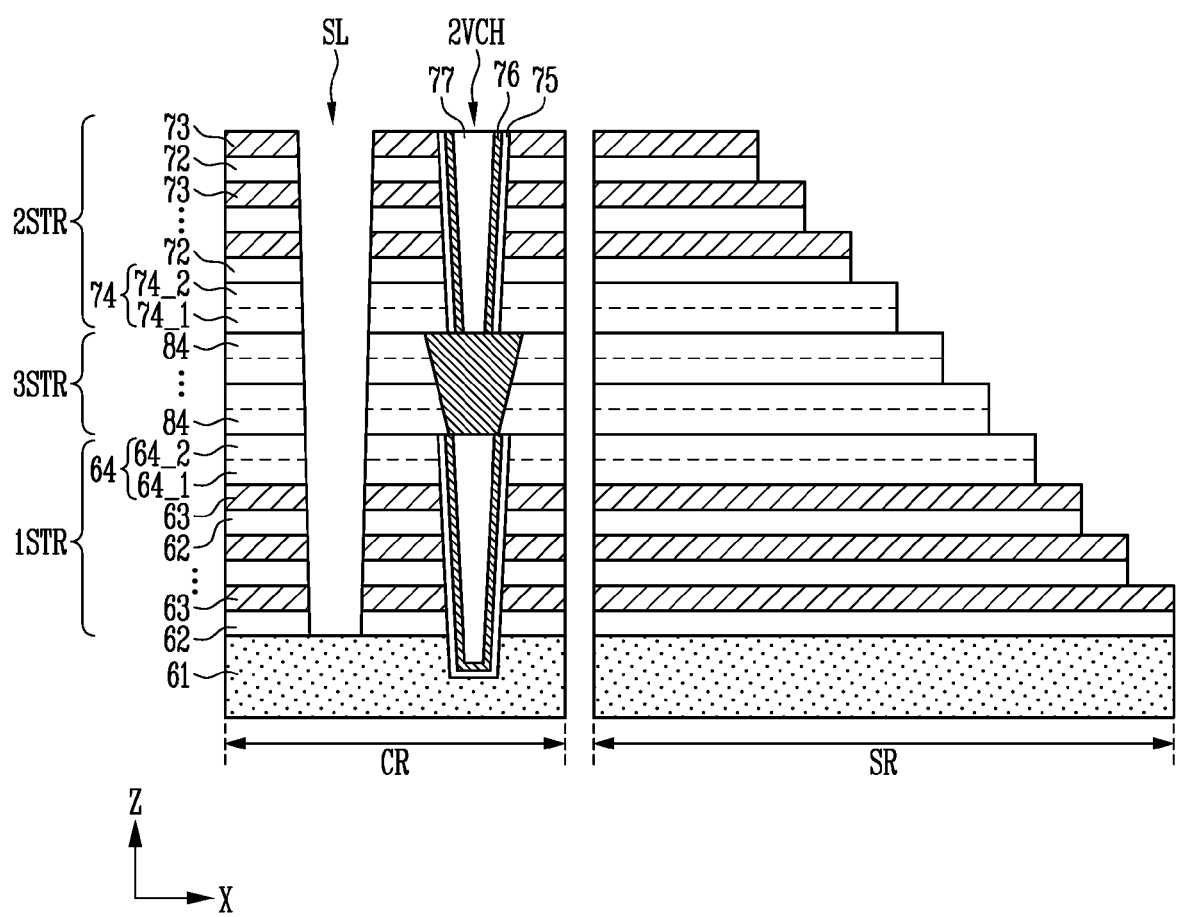

Referring to FIG. 28, a slit SL that vertically separates the first stack structure 1STR, the third interlayer insulating structure 3STR, and the second stack structure 2STR may be formed. For example, the slit SL may be formed by performing an etching process for vertically removing a portion of the first stack structure 1STR, the third interlayer insulating structure 3STR, and the second stack structure 2STR formed in the cell region. The etching process for forming the slit SL may be performed until a portion of the lower structure 61 is exposed. When the slit SL is formed in the cell region CR, the first to seventh material layers 61, 62, 64_1, 64_2, 72, 73, 74_1, 74_2, and 84 may be exposed along an inner wall of the slit SL.

Figure 29:
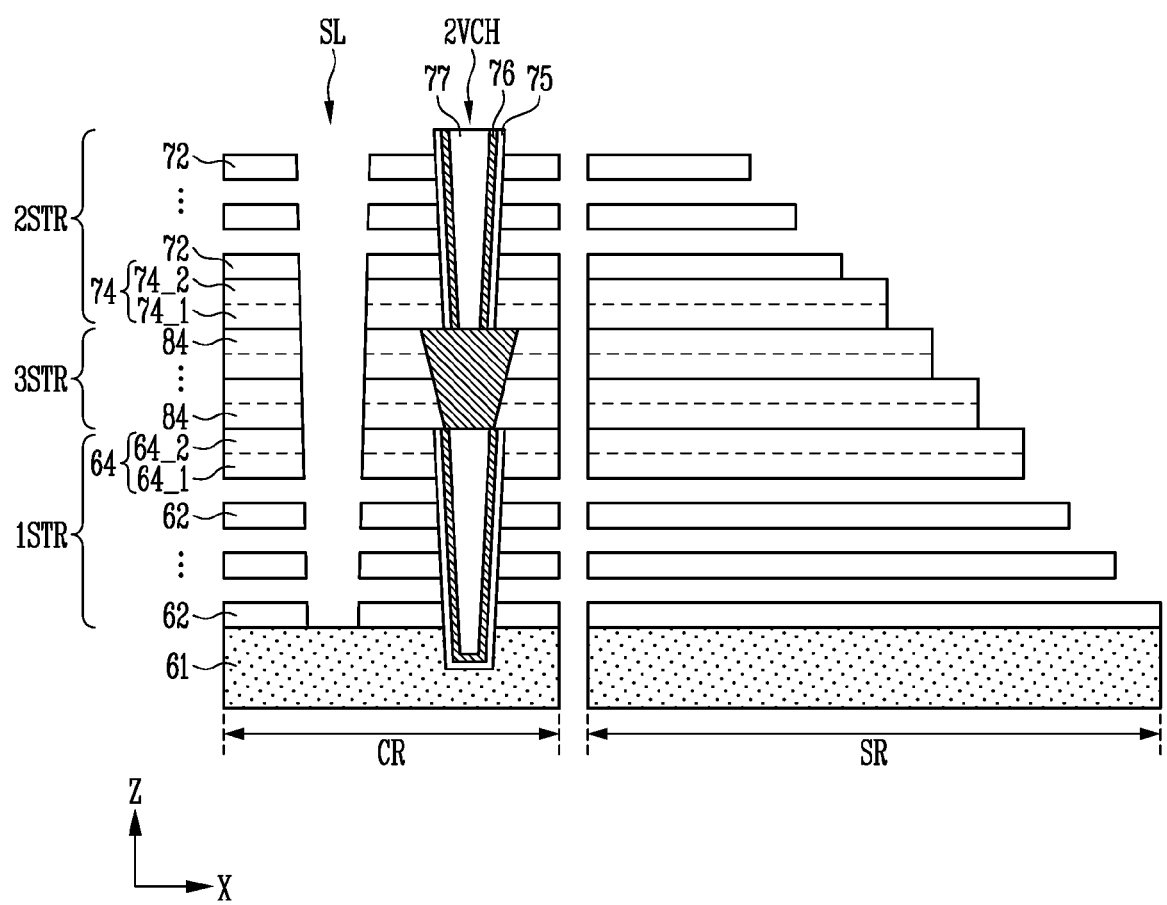

Referring to FIG. 29, an etching process for selectively removing the second and fifth material layers 63 and 73 exposed through the slit SL may be performed. For example, a wet etching process may be performed to selectively remove the second and fifth material layers 63 and 73 formed in the first and second stack structures 1STR and 2STR.

Figure 30:
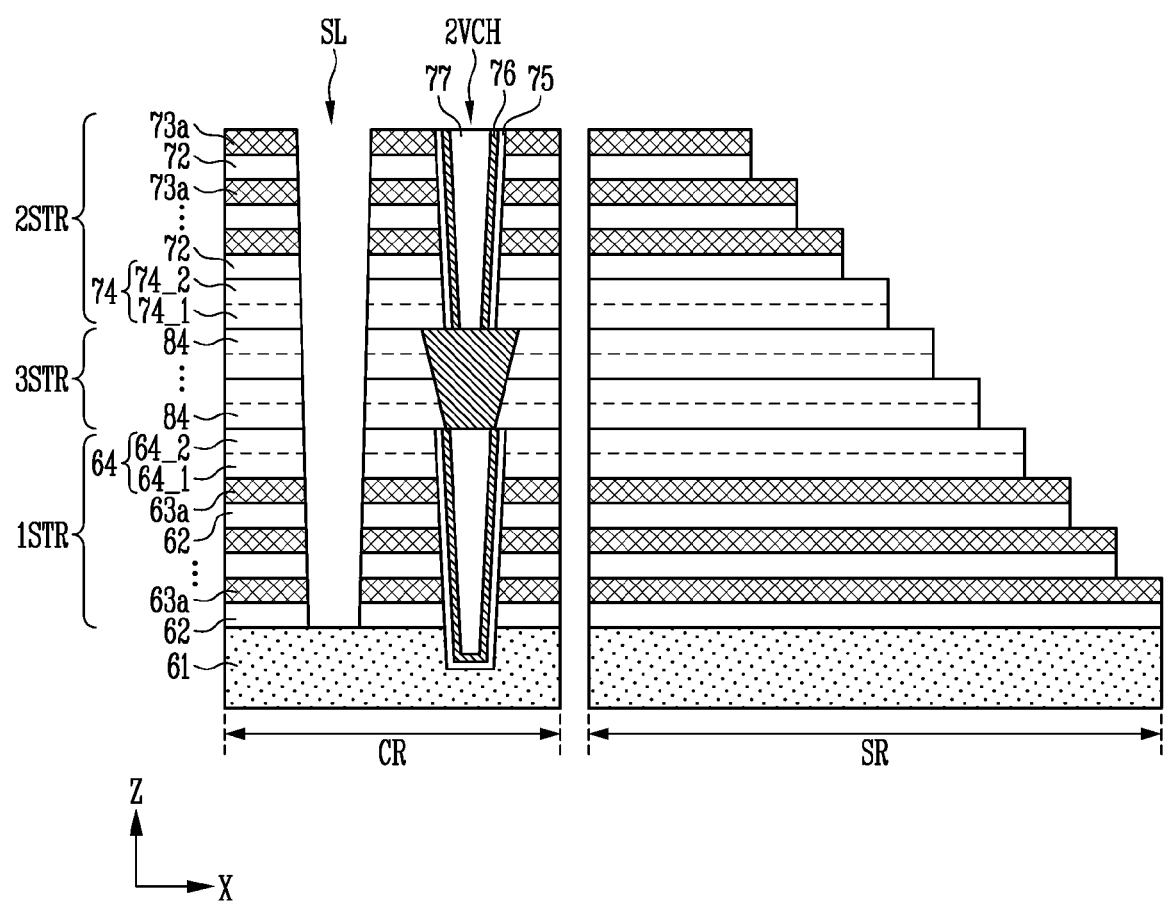

Referring to FIG. 30, conductive layers 63a and 73a for gate lines may be filled in a region from which the second and fifth material layers 63 and 73 are removed. Since the conductive layers 63a and 73a may be used as the word line or the selection line, the conductive layers 63a and 73a may be formed of at least one layer among tungsten (W), cobalt (Co), nickel (Ni), molybdenum (Mo), silicon (Si), and polysilicon (poly-Si).

Figure 31:
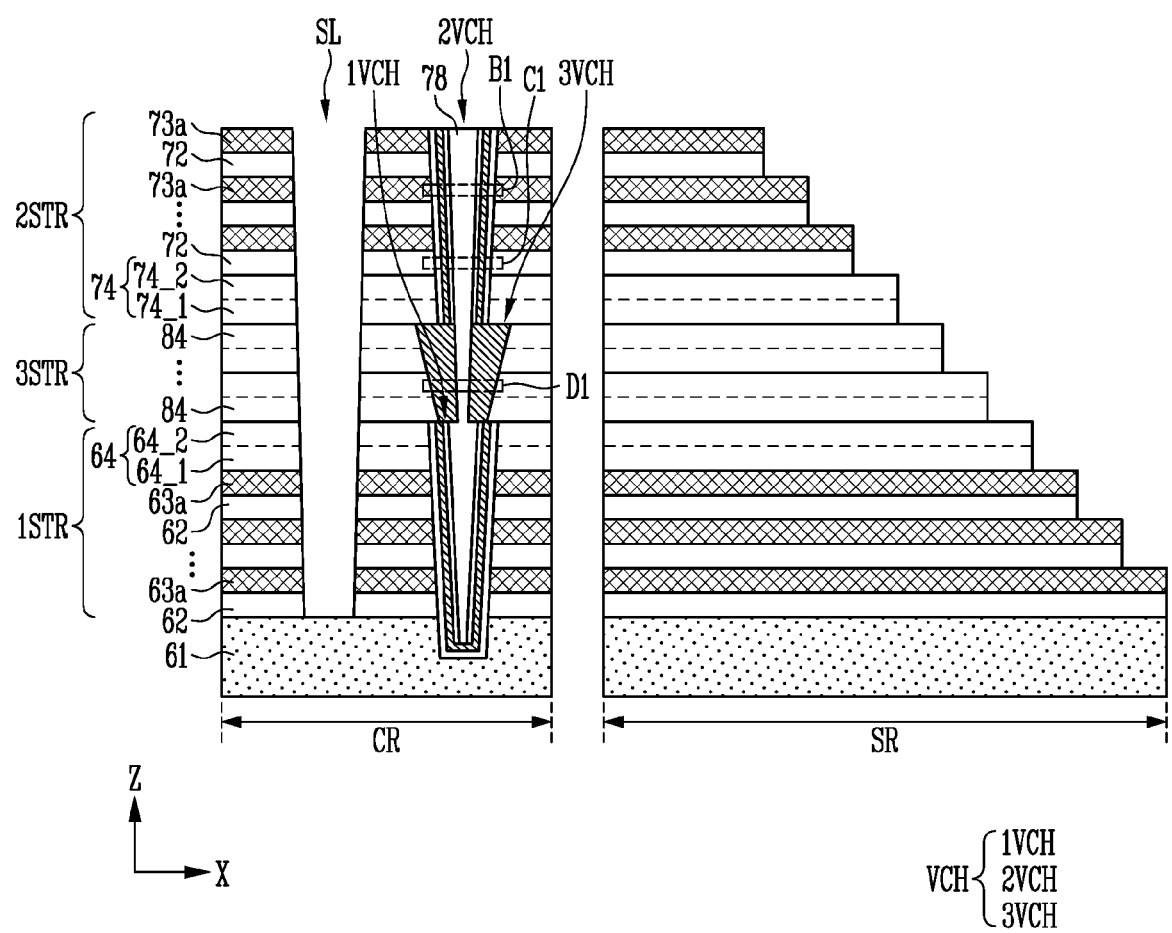
FIGS. 31 and 32 are diagrams illustrating a structure according to a fourth embodiment of the present disclosure.
Figure 32:
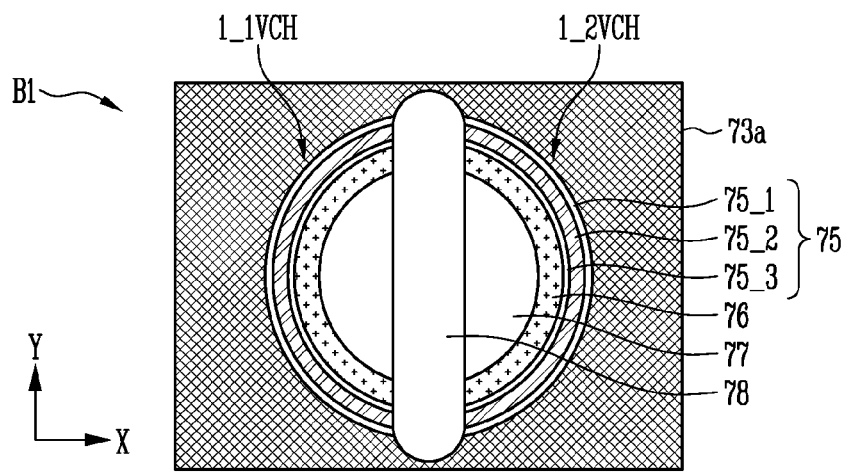
Figure 32:
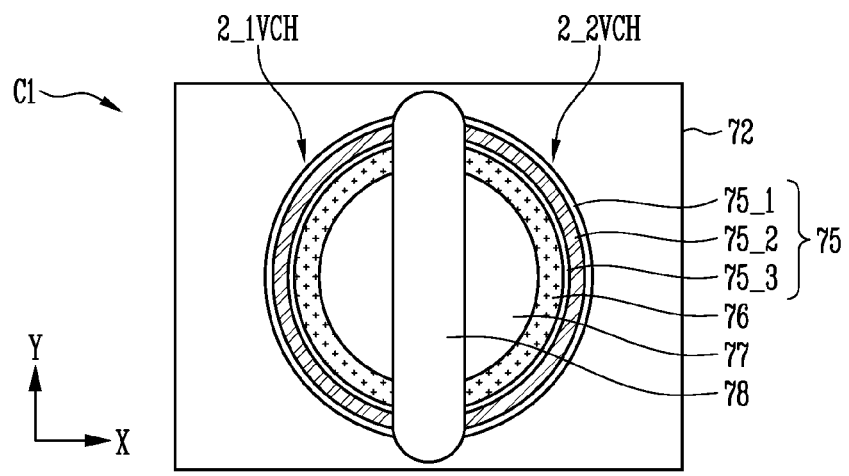
Figure 32:
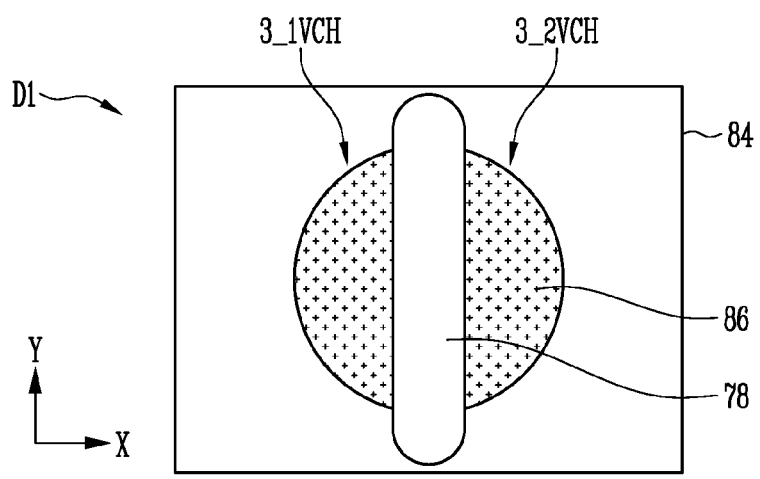

FIGS. 31 and 32 are diagrams illustrating a structure according to a fourth embodiment of the present disclosure.

Cross sections B1, C1 and D1 of the vertical plug VCH identified in FIG. 31 are illustrated in FIG. 32.

Referring to FIGS. 31 and 32 along with FIGS. 21 to 30, a multi stack structure in which a first stack structure 1STR, a third interlayer insulating structure 3STR, and a second stack structure 2STR are formed on a lower structure 61 in which a cell region CR and a slimming region SR are defined is shown.

For example, the first stack structure 1STR may include first material layers 62, conductive layers 63a, and a first interlayer insulating structure 64 alternately stacked on the lower structure 61. The first interlayer insulating structure 64 may be formed on an uppermost end of the first stack structure 1STR, and may include third material layers 64_1 and 64_2 stacked on each other. The first material layers 62 and the first interlayer insulating structure 64 may be formed of the same material. For example, the first material layers 62 and the first interlayer insulating structure 64 may be formed of an oxide layer. The conductive layers 63a may be used as a word line or a selection line in the memory block, and may be formed of at least one layer among tungsten (W), cobalt (Co), nickel (Ni), molybdenum (Mo), silicon (Si), and polysilicon (poly-Si).

The third interlayer insulating structure 3STR may be formed on the first interlayer insulating structure 64. For example, the third interlayer insulating structure 3STR may include seventh material layers 84 stacked on each other on the first interlayer insulating structure 64. The seventh material layers 84 may be formed of the same material as the first material layers 62 or the third material layers 64_1 and 64_2. For example, the seventh material layers 84 may be formed of an oxide layer.

The second stack structure 2STR may be formed on the third interlayer insulating structure 3STR. For example, the second stack structure 2STR may include a second interlayer insulating structure 74 and fourth material layers 72 and conductive layers 73a alternately stacked on the third interlayer insulating structure 3STR. The second interlayer insulating structure 74 may be formed at a lowermost end of the second stack structure 2STR, and may include sixth material layers 74_1 and 74_2 stacked on each other. The sixth material layers 74_1 and 74_2 may be formed of the same material as the third material layers 64_1 and 64_2 or the seventh material layers 84, the fourth material layers 72 may be formed of the same material as the first material layers 62, and the conductive layers 73a may be formed of the same material as the conductive layers 63a. In addition, the fourth material layers 72 and the second interlayer insulating structure 74 may be formed of the same material. For example, the fourth material layers 72 and the second interlayer insulating structure 74 may be formed of an oxide layer. The conductive layers 73a may be used as the word line or the selection line in the memory block, and may be formed of at least one layer among tungsten (W), cobalt (Co), nickel (Ni), molybdenum (Mo), silicon (Si), and polysilicon (poly-Si).

In the slimming region SR, an edge of the first stack structure 1STR including the first interlayer insulating structure 64, the third interlayer insulating structure 3STR, and the second stack structure 2STR including the second interlayer insulating structure 74 may be formed in a successive step shape.

In the cell region CR, at least one or more first vertical plugs 1VCH vertically passing through the first stack structure 1STR, at least one or more third vertical plugs 3VCH formed on the first vertical plugs 1VCH and vertically passing through the third interlayer insulating structure 3STR, and at least one or more second vertical plugs 2VCH formed on the third vertical plugs 3VCH and vertically passing through the second stack structure 2STR may be included.

The first and second vertical plugs 1VCH and 2VCH may include memory layers 65 and 75, channel layers 66 and 76, and the vertical insulating layers 67 and 77 sequentially formed along an inner wall of the first and second vertical holes 1VHc and 2VHc, and the third vertical plug 3VCH may include a channel layer 86 filling the third vertical hole 3VHc.

The memory layers 65 and 75 may be formed in a cylindrical shape along the inner wall of the first and second vertical holes 1VHc and 2VHc. The memory layers 65 and 75 may include blocking layers 65_1 and 75_1, trap layers 65_2 and 75_2, and tunnel insulating layers 65_3 and 75_3 formed in an order adjacent to the first and second vertical holes 1VHc and 2VHc. The blocking layers 65_1 and 75_1 may be formed of an insulating layer including oxide or the like. The trap layers 65_2 and 75_2 may be formed of a material capable of trapping a charge, for example, polysilicon, nitride, a variable resistance material, a phase change material, or the like. The tunnel insulating layers 65_3 and 75_3 may be formed of an insulating layer including oxide. Data may be stored in the first or second vertical plug 1VCH or 2VCH.

The channel layers 66 and 76 of the first or second stack structure 1STR or 2STR may be formed in a cylindrical shape along an inner wall of the memory layers 65 and 75, and the channel layer 86 of the third interlayer insulating structure 3STR may be formed in a cylindrical shape filling an inside of the third vertical hole 3VHc, and the channel layers 66, 76, and 86 may be formed of polysilicon. The vertical insulating layers 67 and 77 may be formed in a cylindrical shape filling an inside of the channel layers 66 and 76, and may be formed of an insulating layer including oxide or the like. Although not shown in the drawing, according to an embodiment, the channel layers 66 and 76 may be formed in a cylindrical shape, and in this case, the vertical insulating layers 67 and 77 might not be formed.

A trench that vertically separates the first, third, and second vertical plugs 1VCH, 3VCH, and 2VCH may be formed in the cell region CR. When an insulating layer is filled inside the trench, a vertical channel separation structure 78 formed of the insulating layer may be formed. The first, third, and second vertical plugs 1VCH, 3VCH, and 2VCH may be vertically separated by the vertical channel separation structure 78. For example, the first vertical plug 1VCH may be vertically separated to include a (1_1)-th sub-vertical plug 1_1VCH and a (1_2)-th sub-vertical plug 1_2VCH, the second vertical plug 2VCH may be vertically separated to include a (2_1)-th sub-vertical plug 2_1VCH and a (2_2)-th sub-vertical plug 2_2VCH, and the third vertical plug 3VCH may be vertically separated to include a (3_1)-th sub-vertical plug 3_1VCH and a (3_2)-th sub-vertical plug 3_2VCH. Each of the (1_1)-th, (1_2)-th, (2_1)-th, (2_2)-th, (3_1)-th, and (3_2)-th sub-vertical plugs 1_1VCH, 1_2VCH, 2_1VCH, 2_2VCH, 3_1VCH, and 3_2VCH may form a cell as an independent vertical plug. For example, memory cells separated by the vertical channel separation structure 78 may be used as different memory cells.

Since the first vertical plug 1VCH is formed before the third vertical plug 3VCH, and the third vertical plug 3VCH is formed before the second vertical plug 2VCH, a pattern of the vertical plug VCH may be rapidly changed in a region where the first stack structure 1STR and the third interlayer insulating structure 3STR are in contact with each other and in a region where the third interlayer insulating structure 3STR and the second stack structure 2STR are in contact with each other. For example, a width of a lower end of the first vertical plug 1VCH may be narrower than a width of an upper end, a width of a lower end of the third vertical plug 3VCH may be narrower than a width of an upper end, and a width of a lower end of the second vertical plug 2VCH may be narrower than a width of an upper end. Since a portion where a width of the first vertical plug 1VCH is widest and a portion where a width of the third vertical plug 3VCH is narrowest are in contact with each other, and a portion where the width of the third vertical plug 3VCH is widest and a portion where a width of the second vertical plug 2VCH is narrowest are in contact with each other, a pattern change of the vertical plug VCH may be great in a region where portions where widths are different from each other are in contact with each other.

As described above, when the gate line is formed in the region where the pattern change of the vertical plug VCH is great, a bridge may occur between the vertical plug VCH and the gate line due to a characteristic of a manufacturing process.

Therefore, in the fourth embodiment, the first interlayer insulating structure 64, the third interlayer insulating structure 3STR, and the second interlayer insulating structure 74 may be formed, and the vertical channel separation structure 78 that vertically separates the first to third vertical plugs 1VCH to 3VCH connected to each other may be formed, so that the vertical plug VCH and the gate line do not overlap each other in the region where the pattern change of the vertical plug VCH is great.

Figure 33:
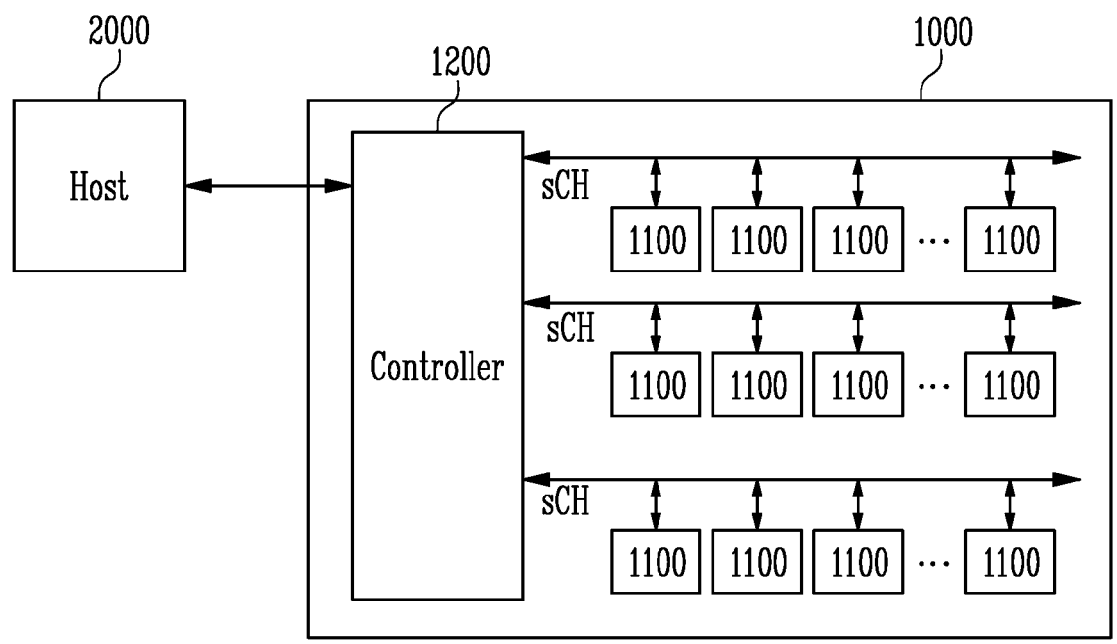
FIG. 33 is a diagram illustrating an embodiment of a memory system including a semiconductor memory device according to an embodiment of the present disclosure.

FIG. 33 is a diagram illustrating an embodiment of a memory system including a semiconductor memory device according to an embodiment of the present disclosure.

Referring to FIG. 33, the memory system 1000 may include a plurality of semiconductor memory devices 1100 in which data is stored, and a controller 1200 that communicates between the semiconductor memory devices 1100 and a host 2000.

Each of the semiconductor memory devices 1100 may be the semiconductor memory device described in the above-described embodiments.

The semiconductor memory devices 1100 may be connected to the controller 1200 through a plurality of system channels sCH. For example, a plurality of semiconductor memory devices 1100 may be connected to one system channel sCH, and the plurality of system channels sCH may be connected to the controller 1200.

The controller 1200 may communicate between the host 2000 and the semiconductor memory devices 1100. In an embodiment, the controller 1200 may control the semiconductor memory devices according to a request of the host 2000 or may perform a background operation for performance improvement of the memory system 1000 even though there is no request from the host 2000.

The host 2000 may generate requests for various operations and output the generated requests to the memory system 1000. For example, the requests may include a program request that may control a program operation, a read request that may control a read operation, an erase request that may control an erase operation, and the like. The host 2000 may communicate with the memory system 1000 through various interfaces such as peripheral component interconnect express (PCIe), advanced technology attachment (ATA), serial ATA (SATA), parallel ATA (PATA), serial attached SCSI (SAS), non-volatile memory express (NVMe)

a universal serial bus (USB), a multi-media card (MMC), an enhanced small disk interface (ESDI), or integrated drive electronics (IDE).

Figure 34:
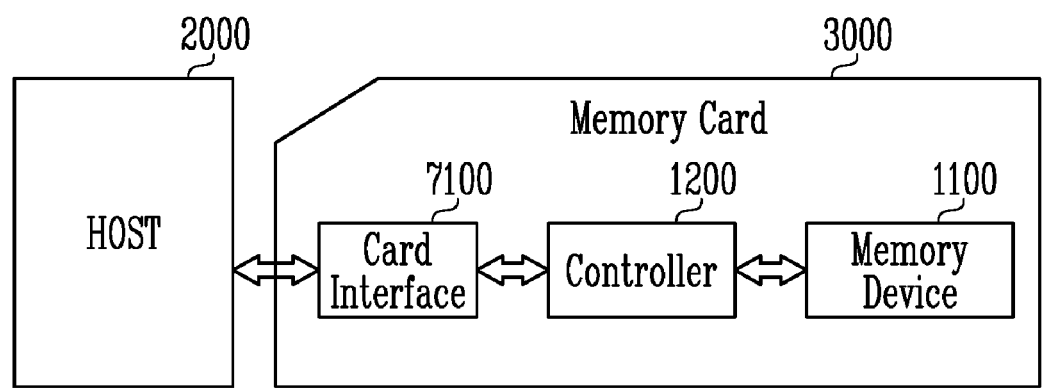
FIG. 34 is a diagram illustrating another embodiment of a memory system including a semiconductor memory device according to an embodiment of the disclosure.

FIG. 34 is a diagram illustrating another embodiment of a memory system including a semiconductor memory device according to an embodiment of the disclosure.

Referring to FIG. 34, the memory system may be implemented as a memory card 3000. The memory system 3000 may include the semiconductor memory device 1100, the controller 1200, and a card interface 7100.

The controller 1200 may control data exchange between the semiconductor memory device 1100 and the card interface 7100. According to an embodiment, the card interface 7100 may be a secure digital (SD) card interface or a multi-media card (MMC) interface, but is not limited thereto.

The card interface 7100 may interface data exchange between the host 2000 and the controller 1200 according to a protocol of the host 2000. According to an embodiment, the card interface 7100 may support a universal serial bus (USB) protocol, and an inter chip (IC)-USB protocol. Here, the card interface 7100 may refer to hardware capable of supporting a protocol that is used by the host 2000, software installed in the hardware, or a signal transmission method.

When the memory card 3000 is connected to a host interface of the host 2000 such as a PC, a tablet PC, a digital camera, a digital audio player, a mobile phone, a console video game hardware, or a digital set-top box, the host interface may perform communication with the semiconductor memory device 1100 through the card interface 7100 and the controller 1200 under control of a microprocessor of the host 2000.

What is claimed is:

1. A semiconductor memory device comprising:
a first stack structure over a lower structure in which a cell region and a slimming region are defined, including first gate lines;
a second stack structure over the first stack structure, including second gate lines;
a first interlayer insulating structure disposed between the first stack structure and the second stack structure; and
a plurality of vertical plugs passing through the first stack structure, the first interlayer insulating structure, and the second stack structure in the cell region,
wherein the first gate lines include first end portions, respectively,
wherein the second gate lines include second end portions, respectively,
wherein the first interlayer insulating structure includes a third end portion, which is not overlapped with the first and second end portions, and
wherein the first to third end portions have a step shape.

2. The semiconductor memory device of claim 1, wherein the upper surfaces and side surfaces of the first to third end portions have the step shape.

3. The semiconductor memory device of claim 1, further comprising a second interlayer insulating structure disposed between the first interlayer insulating structure and the second stack structure.

4. The semiconductor memory device of claim 3, wherein the second interlayer insulating structure includes a fourth end portion, which is not overlapped with the first to third end portions.

5. The semiconductor memory device of claim 3, further comprising:
interlayer insulating layers formed between the first gate lines and between the second gate lines.

6. The semiconductor memory device of claim 5, wherein the first interlayer insulating structure and the second interlayer insulating structure are formed of a layer of the same material as the interlayer insulating layers, and
wherein an edge of the first stack structure and the second stack structure formed in the slimming region are formed in a step shape.

7. The semiconductor memory device of claim 5, wherein the first and the second interlayer insulating structure are thicker than each of the interlayer insulating layers.

8. The semiconductor memory device of claim 4, wherein a height and a distance of the third end portion is different from a height and a distance of each of the first end portions.

9. The semiconductor memory device of claim 1, wherein each of the vertical plugs includes a memory layer, a channel layer, and a vertical insulating layer sequentially formed along an inner wall of vertical holes vertically passing through the first stack structure and the second stack structure.

10. The semiconductor memory device of claim 1, wherein the first to third end portions are disposed in the slimming region.

11. The semiconductor memory device of claim 3, further comprising:
a third interlayer insulating structure formed between the first interlayer insulating structure and the second interlayer insulating structure.

12. The semiconductor memory device of claim 11, wherein the third interlayer insulating structure is thicker than each of interlayer insulating layers.

13. The semiconductor memory device of claim 11, wherein each of the vertical plugs further includes a third vertical plug formed in a portion passing through the third interlayer insulating structure.

14. The semiconductor memory device of claim 13, wherein the third vertical plug connects a first portion and a second portion of channel layer included in the each of the vertical plugs;
wherein the first portion is passing through the first stack structure and the first interlayer insulating structure; and
wherein the second portion is passing through the second stack structure and the second interlayer insulating structure.

15. The semiconductor memory device of claim 1, wherein each of the vertical plugs comprises:
a memory layer formed along an inner wall of a vertical hole, the vertical hole vertically passing through the first stack structure and the second stack structure;
a channel layer formed along an inner wall of the memory layer;
a vertical insulating layer formed in a region surrounded by the channel layer; and
a vertical channel separation structure vertically separating the vertical insulating layer, the channel layer, and the memory layer in a vertical direction.

* * * * *